United States Patent
Park et al.

(10) Patent No.: US 11,556,415 B2
(45) Date of Patent: *Jan. 17, 2023

(54) MEMORY CONTROLLER, MEMORY DEVICE AND STORAGE DEVICE

(71) Applicant: SAMSUNG ELECTRONICS CO., LTD., Suwon-si (KR)

(72) Inventors: Sehwan Park, Yongin-si (KR); Jinyoung Kim, Seoul (KR); Ilhan Park, Suwon-si (KR); Youngdeok Seo, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/397,321

(22) Filed: Aug. 9, 2021

(65) Prior Publication Data
US 2022/0222138 A1 Jul. 14, 2022

(30) Foreign Application Priority Data
Jan. 14, 2021 (KR) .................. 10-2021-0005212

(51) Int. Cl.
*G06F 11/10* (2006.01)
*G06F 11/07* (2006.01)
(Continued)

(52) U.S. Cl.
CPC ........ *G06F 11/1068* (2013.01); *G06F 3/0619* (2013.01); *G06F 3/0656* (2013.01);
(Continued)

(58) Field of Classification Search
CPC .. G06F 11/1068; G06F 3/0619; G06F 3/0656; G06F 3/0659; G06F 3/0673; G11C 16/0483; G11C 16/26
See application file for complete search history.

(56) References Cited

U.S. PATENT DOCUMENTS

| 8,301,912 | B2 | 10/2012 | Lin et al. |
| 10,090,046 | B2 | 10/2018 | Park et al. |

(Continued)

FOREIGN PATENT DOCUMENTS

| KR | 10-2019-0025359 A | 3/2019 |
| KR | 10-2022-0003705 A | 1/2022 |

OTHER PUBLICATIONS

Communication dated Jul. 19, 2022 by the European Patent Office in European Patent Application No. 22150726.2.

*Primary Examiner* — Guy J Lamarre
(74) *Attorney, Agent, or Firm* — Sughrue Mion, PLLC

(57) ABSTRACT

A memory device may determine cell count information from a threshold voltage distribution of memory cells and may determine a detection case based on the cell count information when an error in read data, received from the memory device performing a read operation is not corrected. A memory controller may control the memory device to execute a read operation using a development time determined in consideration of an offset voltage of a read voltage corresponding to the detection case. When an error in the read data is successfully corrected, the memory controller may update a table, stored in the memory controller, using a dynamic offset voltage obtained by inputting the cell count information to a machine learning model.

20 Claims, 20 Drawing Sheets

(51) Int. Cl.
*G06F 11/30* (2006.01)
*G06F 11/14* (2006.01)
*G06F 3/06* (2006.01)
*G11C 16/04* (2006.01)
*G11C 16/26* (2006.01)

(52) U.S. Cl.
CPC .......... *G06F 3/0659* (2013.01); *G06F 3/0673* (2013.01); *G11C 16/0483* (2013.01); *G11C 16/26* (2013.01)

(56) References Cited

U.S. PATENT DOCUMENTS

| | | |
|---|---|---|
| 10,120,589 B2 | 11/2018 | Jung |
| 10,373,693 B2 | 8/2019 | Cha et al. |
| 10,559,362 B2 | 2/2020 | Shin et al. |
| 10,607,708 B2 | 3/2020 | Oh et al. |
| 10,629,259 B2 | 4/2020 | Jang |
| 11,393,551 B2 * | 7/2022 | Seo ................ G11C 7/109 |
| 2013/0219107 A1 | 8/2013 | Lee et al. |
| 2014/0229131 A1 | 8/2014 | Cohen et al. |
| 2018/0108422 A1 | 4/2018 | Oh |
| 2019/0072635 A1 | 3/2019 | Kang et al. |
| 2019/0278480 A1 | 9/2019 | Lam et al. |
| 2020/0098436 A1 | 3/2020 | Kim et al. |
| 2020/0151539 A1 | 5/2020 | Oh et al. |
| 2022/0005539 A1 | 1/2022 | Kim et al. |

* cited by examiner

HRT : Before Update

|  | RP1 | RP2 | RP3 | RP4 | RP5 | RP6 | RP7 |
|---|---|---|---|---|---|---|---|
| Level Offset | 0 mV | 0 mV | 0 mV | 0 mV | 0 mV | 0 mV | 0 mV |

HRT : After Update

|  | RP1 | RP2 | RP3 | RP4 | RP5 | RP6 | RP7 |
|---|---|---|---|---|---|---|---|
| Level Offset | 0 mV | 0 mV | 0 mV | 0 mV | 0 mV | 0 mV | -76 mV |

|  |  | OVS Detection Cases | | | | |
|---|---|---|---|---|---|---|
|  |  | C4 | C1 | C2 | C3 | C5 |
| State offset | RP1 | −40 mV | −32 mV | 0 mV | 32 mV | 40 mV |
| | RP2 | −30 mV | −24 mV | 0 mV | 24 mV | 30 mV |
| | RP3 | −20 mV | −16 mV | 0 mV | 16 mV | 20 mV |
| | RP4 | −40 mV | −32 mV | 0 mV | 32 mV | 40 mV |
| | RP5 | −60 mV | −48 mV | 0 mV | 48 mV | 60 mV |
| | RP6 | −80 mV | −64 mV | 0 mV | 64 mV | 80 mV |
| | RP7 | −100 mV | −80 mV | 0 mV | 80 mV | 100 mV |

FIG. 17

HRT : Before Update

|  | RP1 | RP2 | RP3 | RP4 | RP5 | RP6 | RP7 |
|---|---|---|---|---|---|---|---|
| Level Offset | 0 mV | 0 mV | 0 mV | 0 mV | 0 mV | 0 mV | 0 mV |

HRT : After Update

|  | RP1 | RP2 | RP3 | RP4 | RP5 | RP6 | RP7 |
|---|---|---|---|---|---|---|---|
| Level Offset | 0 mV | 0 mV | 0 mV | 0 mV | 0 mV | 0 mV | −80 mV |

FIG. 18

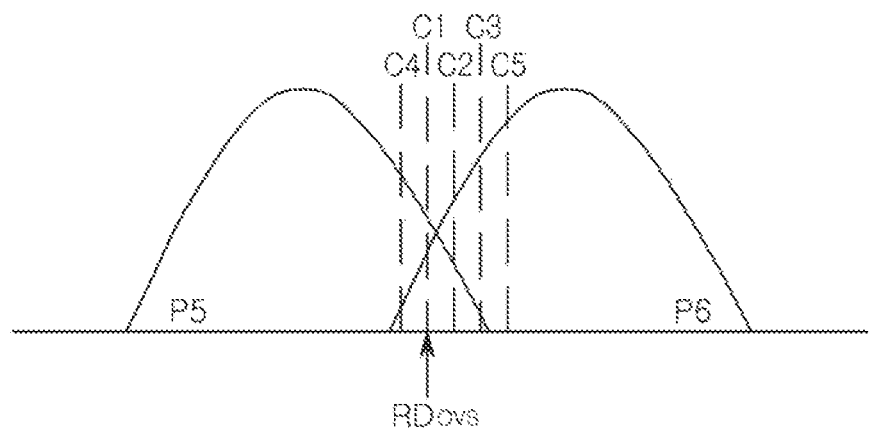
FIG. 19
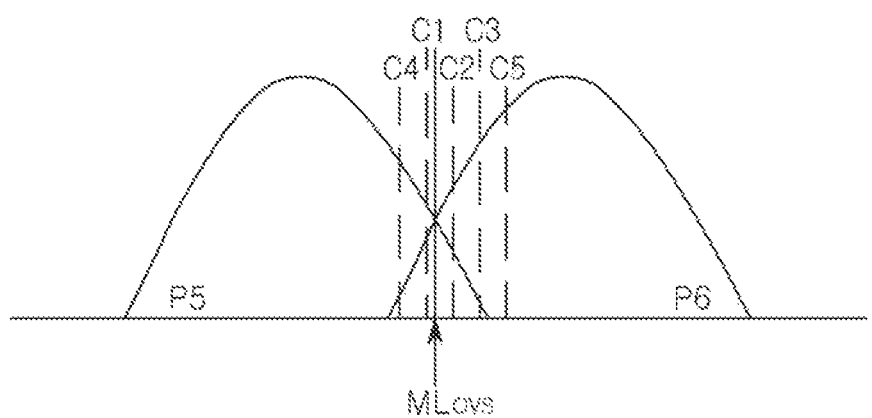
FIG. 20
HRT : Before Update
|  | RP1 | RP2 | RP3 | RP4 | RP5 | RP6 | RP7 |
|---|---|---|---|---|---|---|---|
| Level Offset | 0 mV | 0 mV | 0 mV | 0 mV | 0 mV | 0 mV | -76 mV |
HRT : After Update
|  | RP1 | RP2 | RP3 | RP4 | RP5 | RP6 | RP7 |
|---|---|---|---|---|---|---|---|
| Level Offset | 0 mV | 0 mV | 0 mV | 0 mV | 0 mV | -58 mV | -76 mV |
FIG. 21

MEMORY CONTROLLER, MEMORY DEVICE AND STORAGE DEVICE

CROSS-REFERENCE TO RELATED APPLICATION(S)

This application claims priority to Korean Patent Application No. 10-2021-0005212 filed on Jan. 14, 2021 in the Korean Intellectual Property Office, the disclosure of which is incorporated by reference herein in its entirety.

BACKGROUND

1. Field

The present disclosure relates to a memory controller, a memory device, and a storage device.

2. Background of the Related Art

A memory device may provide a function of writing and erasing data or reading written data. The memory device may perform a program operation, an erase operation, a read operation, and the like, in response to control signals transmitted by a memory controller, and data obtained by the memory device in the read operation may be output to the memory controller. The memory controller may correct an error in data obtained as a result of the read operation, and may instruct the memory device to perform an additional read operation when correction of the error fails.

SUMMARY

It is an aspect to provide a memory controller, a memory device, and a storage device which may secure reliability of a read operation by updating a table, writing an offset voltage for a read voltage, to an accurate value for a next read operation when a read operation is successful.

According to an aspect of an example embodiment, a memory controller comprises a plurality of control pins configured to output control signals to at least one memory device; a plurality of data pins configured to transmit and receive a data signal to and from the at least one memory device; a buffer memory configured to store a table in which a static offset voltage for a read operation is written, and to store a machine learning model that receives cell count information corresponding to a threshold voltage distribution of memory cells included in the at least one memory device and generates a dynamic offset voltage for the read operation; an error correction circuit; and a processor configured to, when the error correction circuit fails to correct an error in read data obtained from the at least one memory device, instruct the at least one memory device to perform an optimal read operation of adjusting an operating condition of the read operation and obtaining read data, wherein, when the error correction circuit successfully corrects an error in read data obtained by the optimal read operation, the processor inputs the cell count information, received from the at least one memory device as a result of the optimal read operation, to the machine learning model to obtain the dynamic offset voltage and updates the table using the dynamic offset voltage.

According to another aspect of an example embodiment, a storage device comprises at least one memory device; and a memory controller connected to the at least one memory device by control pins, carrying at least one of a command latch enable (CLE) signal, an address latch enable (ALE) signal, a chip enable (CE) signal, a read enable (RE) signal, and a data strobe (DQS) signal, and data pins transmitting and receiving a data signal, the memory controller configured to store a table that stores a static offset voltage of a read voltage, and to determine a dynamic offset voltage, wherein, when an error in first read data, output by the at least one memory device executing a first read operation is not corrected, the memory controller controls the at least one memory device to execute a second read operation including an on-chip valley search (OVS) operation, and wherein, when an error in second read data, output by the at least one memory device executing the second read operation is corrected, the memory controller updates the table using the dynamic offset voltage obtained by inputting at least a portion of OVS detection information, generated by the OVS operation, to a machine learning model.

According to yet another aspect of an example embodiment, a memory device comprises an input/output interface including a plurality of control pins that receive control signals from a memory controller, and a plurality of data pins over which a data signal is transmitted to and received from the memory controller, the input/output interface configured to receive a first read command and a second read command from the memory controller; a memory cell array having a plurality of memory cells; and a logic circuit configured to output read data, obtained from the plurality of memory cells, to the memory controller in response to at least one of the first read command and the second read command, wherein when the second read command is received after a first read operation corresponding to the first read command is executed on selected memory cells of the plurality of memory cells, a second read operation, different from the first read operation, is executed and detection information generated in the second read operation is output to the memory controller, and wherein when a read command instructing a history read operation for selected memory cells of the plurality of memory cells is received, a read voltage included in the read command has a level different from a level of an optimal read voltage determined in the second read operation.

According to yet another aspect of an example embodiment, a method of controlling a memory device comprises transmitting a first read command including a read voltage having a default level to the memory device; when an error in read data received as a response of the first read command is not corrected, transmitting a second read command to the memory device, the second read command controlling the memory device such that an on-chip valley search (OVS) operation is executed to generate cell count information and a read operation is executed depending on a detection case determined based on the cell count information; and when an error in read data received as a response of the second read command is successfully corrected, updating a table, in which a static offset voltage of the read voltage is written, using a dynamic offset voltage, the dynamic offset voltage being obtained by inputting the cell count information to a pre-trained machine learning model.

BRIEF DESCRIPTION OF DRAWINGS

The above and other aspects will be more clearly understood from the following detailed description, taken in conjunction with the accompanying drawings, in which:

FIGS. 14 to 18 are diagrams illustrating a table update method of a memory controller according to example embodiments;

FIGS. 19 to 21 are diagrams illustrating a table update method of a memory controller according to example embodiments;

DETAILED DESCRIPTION

Hereinafter, example embodiments will be described with reference to the accompanying drawings.

Figure 1:
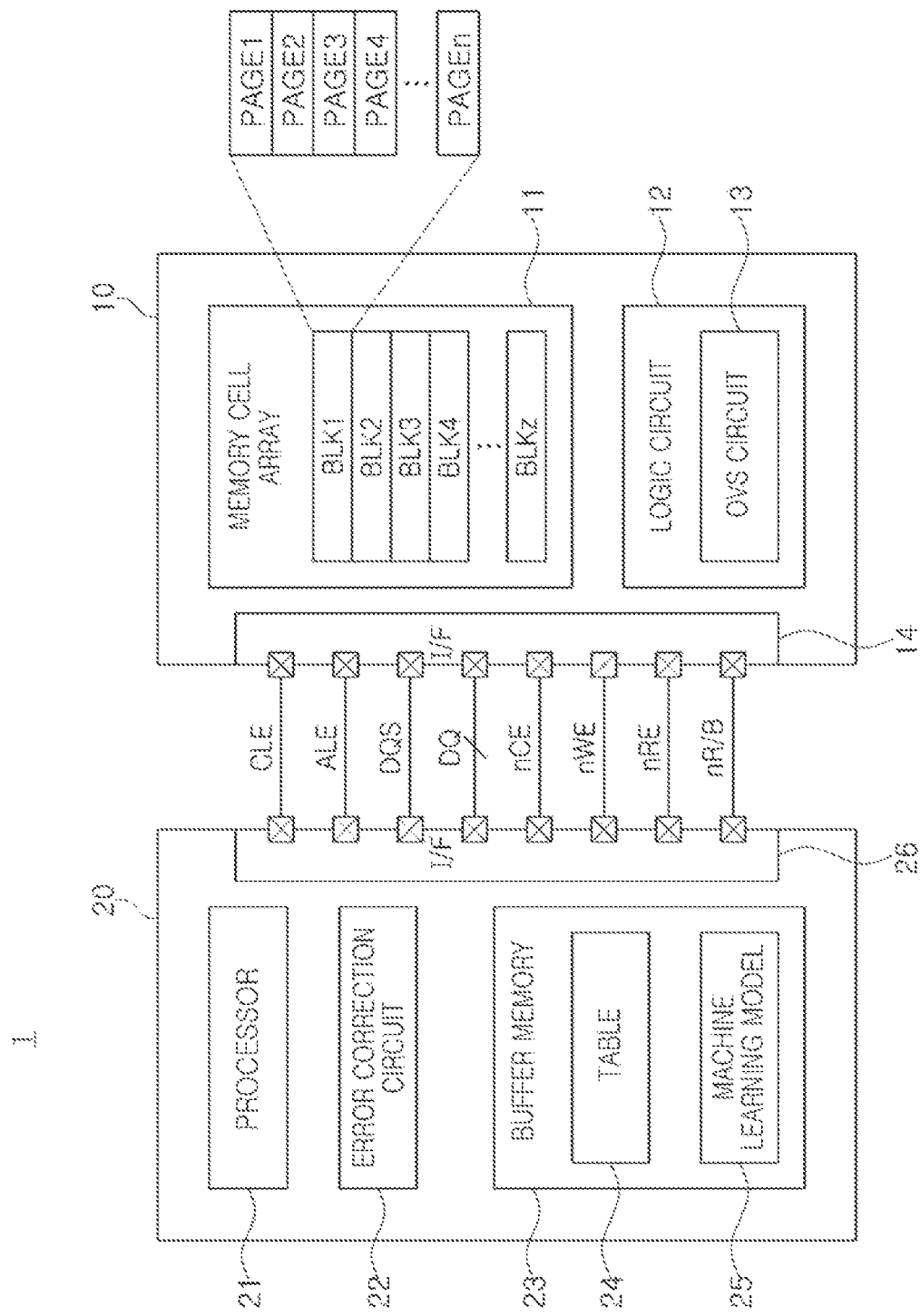
FIG. 1 is a schematic view of a storage device including a memory controller and a memory device according to example embodiments.

FIG. 1 is a schematic view of a storage device including a memory controller and a memory device according to example embodiments.

Referring to FIG. 1, a storage device 1 according to example embodiments may include a memory controller 20 and at least one memory device 10, and the like. The memory device 10 may be implemented to store data. The memory device 10 may include a NAND flash memory, a vertical NAND flash memory, a NOR flash memory, a resistive random access memory (RRAM), a phase-change random access memory (PRAM), a magnetoresistive random access memory (MRAM), a ferroelectric random access memory (FRAM), a spin transfer torque random access memory (STT-RAM), or the like. In addition, the memory device 10 may be implemented to have a three-dimensional array structure.

The memory device 10 may include a memory cell array 11, a logic circuit 12, a memory interface (I/F) 14, and the like. The memory cell array 11 may include a plurality of memory blocks BLK1 to BLKz. Each of the plurality of memory blocks BLK1 to BLKz may include a plurality of pages PAGE1 to PAGEn, and a plurality of memory cells may be included in each of the plurality of pages PAGE1 to PAGEn. Each of the plurality of memory cells may store one or more bits. For example, two or more bits of data may be stored in a single memory cell.

The logic circuit 12 may control the memory cell array 11 in response to control signals received from the memory controller 20 through a memory interface 14. As an example, the logic circuit 12 may exchange control signals with the memory controller 20 when a chip enable signal nCE is in an enable state. The logic circuit 12 may obtain a command signal and an address signal, included in a data signal DQ, during an enable period of a command latch enable signal CLE and an address latch enable signal ALE. As an example, the logic circuit 12 may obtain a command signal and/or an address signal from the data signal DQ at a toggle timing of a read enable signal nRE and a write enable signal nWE. The logic circuit 12 may execute a read operation, a program operation, an erase operation, and the like, based on the command signal and the address signal.

The logic circuit 12 may output read data as the data signal DQ in synchronization with a data strobe signal DQS, or may obtain write data included in the data signal DQ in synchronization with the data strobe signal DQS. As an example, before outputting read data, the logic circuit 12 or the memory interface 14 may generate the data strobe signal DQS based on the read enable signal nRE. The memory interface 14 may output read data through the data signal DQ synchronized with the data strobe signal DQS. In addition, the logic circuit may transmit a state of the memory device 10 to the memory controller 20 using a ready/busy signal nR/B.

In addition, the logic circuit 12 may include an on-chip valley search (OVS) circuit 13. The OVS circuit 13 may execute an on-chip valley search operation. The on-chip valley search operation may include a first sensing operation, in which a detection case is determined based on a cell count, and a second sensing operation in which data is read from selected memory cells by changing development time and/or a level of a read voltage depending on the detection case determined in the first sensing operation. Detailed descriptions of the on-chip valley search operation will be understood with reference to KR 10-2019-0025359; US 2020-0098436; U.S. Pat. Nos. 10,090,046; 10,559,362; 10,607,708; and 10,629,259, the entire contents of each of which being incorporated by reference herein.

The memory controller 20 may include a processor 21, an error correction circuit 22, a buffer memory 23, a controller interface (UF) 26, and the like. The processor 21 may control all operations of the memory controller 20 and may generate a command signal, an address signal, and the like, for controlling the memory device 10. The controller interface 26 may be connected to the memory interface 14 through control pins and data pins. Control signals such as the command latch enable signal CLE, the address latch enable signal ALE, the data strobe signal DQS, the chip enable signal nCE, the read enable signal nRE, the write enable signal nWE, and the ready/busy signals nR/B may be transmitted through the control pins, and the data signal DQ may be transmitted through data pins.

The error correction circuit 22 may generate an error correction code in a program operation and may correct an error in read data, received from the memory device 10, using the error correction code in a read operation. The error correction circuit 22 may correct an error using a coded modulation such as a low density parity check (LDPC) code, a BCH code, a turbo code, a Reed-Solomon code, a convolution code, a recursive systematic code (RSC), a trellis-coded modulation (TCM), and/or a block coded modulation (BCM), and the like.

The buffer memory 23 may store a table 24 and a machine learning model 25. As an example, the table 24 may include a first table, a second table, and a third table. The first table may be a table in which a first static offset voltage is written. The first static offset voltage may be classified into various types of degradation data including a time elapsed after a program operation, for example, an operation temperature, a program/erase cycle, a read cycle, an open wordline case, and the like, and then written in the first table.

The second table may be a table in which a second static offset voltage is written after matching the detection case determined by executing the OVS operation by the memory device 10. When the memory controller 20 receives the detection case, e.g., a result of the OVS operation, from the memory device 10, the processor 21 may determine the second static offset voltage based on the received detection case and the second table.

The third table may be a table in which a third static offset voltage associated with a history read operation is written. In an example embodiment, the third static offset voltage may be determined by the first static offset voltage and the second static offset voltage. The third static offset voltage may include data on an optimal read level of a read voltage for the history read operation. Details of the history read operation will be understood with reference to U.S. Pat. Nos. 10,120,589 and 10,373,693, the entire contents of each of which being incorporated by reference herein.

When an error in the read data, obtained from the memory device 10 as a result of the read operation, is not corrected by the error correction circuit 22, the memory controller 20 may instruct a read operation to the memory device 10 again. In this case, the read operation, instructed to the memory device 10 by the memory controller 20, may be an optimized read operation in which the memory device 10 adjusts an operating condition of the read operation to obtain and output read data. The operating condition of the read operation, adjusted in the optimized read operation, may be a development time and/or a level of the read voltage. As an example, the optimized read operation may be an OVS read operation including a first sensing operation, in which the memory device 10 obtains cell count information and determines a detection case based on the cell count information, and a second sensing operation in which a read operation is executed depending on the detection case determined in the first sensing operation and read data is generated.

The memory controller 20 may receive not only read data generated in the second sensing operation but also cell count information generated in the first sensing operation and a detection case determined based on the cell count information, as detection information. In other words, the memory controller 20 may receive detection information including the read data, the cell count information, and the detection case. The cell count information may include the number of memory cells turned on or off depending on a level of the read voltage and/or the development time.

When an error in the read data generated by the second sensing operation is corrected by the error correction circuit 22, the processor 21 may input the detection information into the machine learning model 25. For example, the processor may input the cell count information, received as the detection information, to the machine learning model 25. The machine learning model 25 may receive the detection information, e.g., the cell count information, or the like, to be pre-trained to output an optimum offset voltage for a read voltage. According to embodiments, the machine learning model 25 may additionally receive addresses of memory cells on which an optimal read operation is executed, deterioration information of the memory cells, and the like.

The processor 21 may update the third table using the offset voltage output by the machine learning model 25. Accordingly, the offset voltage reflected in the read voltage by the logic circuit 12 of the memory device 10 and the offset voltage used by the processor 21 to update the third table may have different levels due to the optimal read operation.

When the error correction circuit 22 fails to correct an error in read data generated by the second sensing operation, the processor 21 may input cell count information to the machine learning model 25. The processor 21 may determine a corrected read voltage using the offset voltage output from the machine learning model 25, and may instruct the memory device 10 to re-execute the read operation using the corrected read voltage.

In an example embodiment, when an error in read data obtained by a general read operation is not corrected, the memory controller 20 may instruct the memory device 10 to execute an optimal read operation including an OVS operation. When correction of an error in read data obtained by the optimal read operation is successful, the memory controller 20 may input cell count information, received as a result of the OVS operation from the memory device 10, to the machine learning model 25 to generate a dynamic offset voltage and may update the third table using the dynamic offset voltage. Accordingly, the offset voltage written in the third table, i.e., a history table, may be maintained on an optimal level, and reliability of the read operation may be improved and time required for the read operation may be reduced, and thus, latency of the read operation may be improved.

Figure 2:
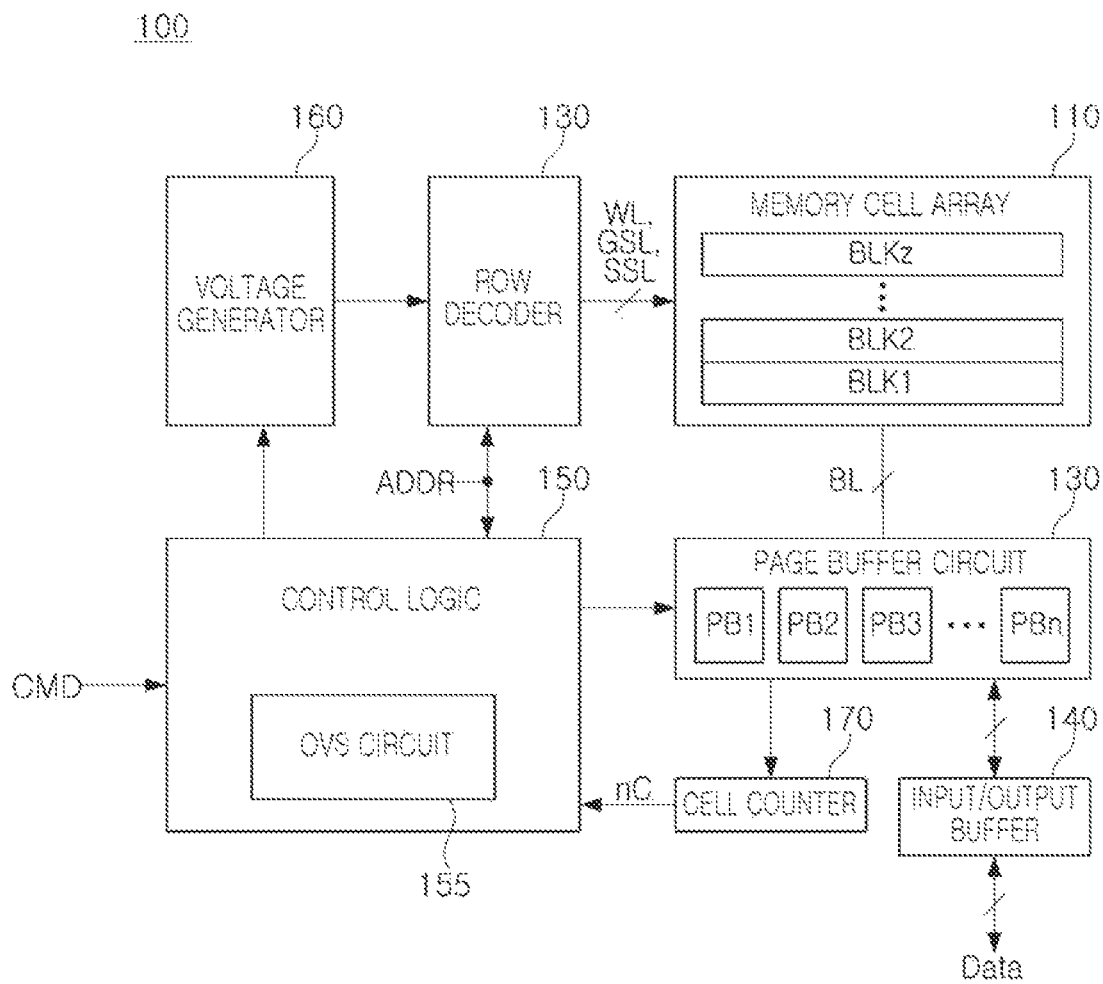
FIG. 2 is a schematic view of a memory device according to example embodiments.

FIG. 2 is a schematic view of a memory device according to example embodiments.

Referring to FIG. 2, a memory device 100 may include a memory cell array 110, a row decoder 120, a page buffer circuit 130, an input/output buffer 140, a control logic 150, a voltage generator 160, a cell counter 170, and the like. As an example, the memory device 100 illustrated in FIG. 2 may be a NAND flash memory.

The memory cell array 110 may be connected to the row decoder 120 through wordlines WL or selected lines SSL and GSL. The memory cell array 110 may be connected to the page buffer circuit 130 through bitlines BL. The memory cell array 110 may include a plurality of cell strings. A channel of each of the cell strings may be formed in a vertical or horizontal direction, and each of the cell strings may include a plurality of memory cells. In the memory cell array 110, cell strings may be divided into a plurality of memory blocks BLK1 to BLKz.

The row decoder 120 may select at least one of the memory cells of the memory cell array 110 in response to an address ADDR. The row decoder 120 may select at least one of the wordlines WL in response to the address ADDR. The row decoder 120 may transmit a bias voltage for executing a program operation, a read operation, an erase operation, or the like, to a selected wordline among the wordlines WL. During the program operation, the row decoder 120 may apply a program voltage and a verify voltage to a selected wordline, and may apply a pass voltage to unselected wordlines. During the read operation, the row decoder 120 may apply a read voltage to a selected wordline, and may apply a read pass voltage to unselected wordlines.

The page buffer circuit 130 may operate as a write driver or a sense amplifier. The page buffer circuit 130 may include a plurality of page buffers PB1 to PBn. During the program operation, the page buffer circuit 130 may apply a bitline voltage, corresponding to data to be programmed, to a selected bitline among the bitlines BL of the memory cell array 110. During the read operation or the verify operation, the page buffer circuit 130 may detect data, stored in a selected memory cell, through a selected bitline. Each of the plurality of page buffers PB1 to PBn, included in the page buffer circuit 130, may be connected to at least one bitline.

Each of the plurality of page buffers PB1 to PBn may be implemented to execute an OVS operation. Each of the memory cells may have one state, among a plurality of states, according to written data, and the plurality of states may be defined based on a threshold voltage of each of the memory cells. Each of the plurality of page buffers PB1 to PBn may execute a plurality of sensing operations to identify states of selected memory cells under the control of the control logic 150. In addition, each of the plurality of page buffers PB1 to PBn may store data sensed through a plurality of sensing operations, and may then select a certain piece of data under the control of the control logic 150. For example, each of the plurality of page buffers PB1 to PBn may execute a sensing operation two or more times. In addition, each of the plurality of page buffers PB1 to PBn may select or output optimal data, among a plurality of pieces of data sensed according to the control of the control logic 150.

The input/output buffer 140 may receive externally provided data and provide the externally provided data to the page buffer circuit 130. In addition, the input/output buffer 140 may receive an externally provided command CMD and provide the externally provided command CMD to the control logic 150. The input/output buffer 140 may receive an externally provided address ADDR and provide the externally provided address ADDR to the control logic 150 and/or the row decoder 120. In addition, the input/output buffer 140 may output data, sensed and latched by the page buffer circuit 130, to an external entity.

The control logic 150 may control the row decoder 120, the page buffer circuit 130, the voltage generator 160, and the like, in response to an externally transmitted command CMD. In addition, the control logic 150 may include an OVS circuit 155 executing an OVS operation. The OVS circuit 155 may control the page buffer circuit 130 and the voltage generator 160 for the OVS operation. The OVS circuit 155 may control the page buffer circuit 130 to execute a plurality of sensing operations to identify specific states of selected memory cells. In addition, the OVS circuit 155 may store sensing data, corresponding to each of the plurality of sensing results, in a plurality of latch sets, respectively provided in the plurality of page buffers PB1 to PBn.

The OVS circuit 155 may store detection information generated by the OVS operation. The detection information may include cell count information nC, generated in the OVS operation, and a detection case determined based on the cell count information nC. The OVS circuit 155 may output the detection information to an external memory controller. According to embodiments, the detection information may be output in response to a special command transmitted from the memory controller, for example, a get feature command or a status read command. The detection information may be stored in the memory controller, and may be used to update a table for determining a level of the read voltage and to determine an offset voltage for optimizing the read voltage.

The cell counter 170 may be implemented to count memory cells, each having a threshold voltage within a specific range, from sensed data in the page buffer circuit 130. For example, the cell counter 170 may process sensed data in each of the page buffers PB1 to PBn to count the number of memory cells, each having a threshold voltage within a specific range. In an example embodiment, the cell count information nC output by the cell counter 170 may be used as input data in order for the memory controller to obtain a dynamic offset voltage from a machine learning model.

Figure 3:
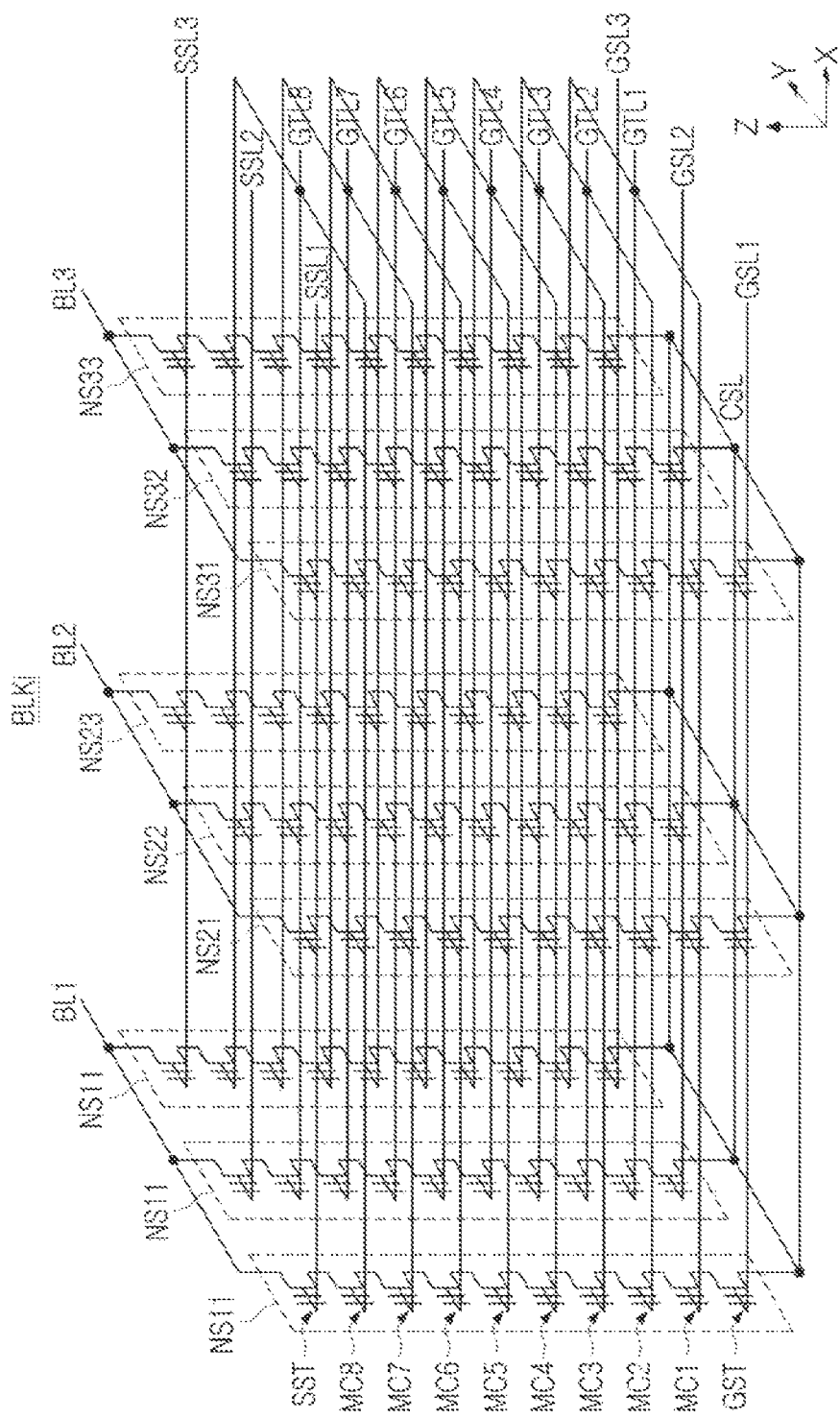
FIG. 3 is a circuit diagram of a memory cell array included in a memory device according to example embodiments.

FIG. 3 is a circuit diagram of a memory cell array included in a memory device according to example embodiments.

FIG. 3 is a diagram illustrating a 3D V-NAND structure which may be applied to a memory device of a memory system according to example embodiments. When the memory device is implemented as a 3D V-NAND type flash memory, each of a plurality of memory blocks included in the memory cell array may be represented by an equivalent circuit as illustrated in FIG. 3.

A memory block BLKi illustrated in FIG. 3 represents a three-dimensional memory block formed on a substrate in a three-dimensional structure. For example, a plurality of memory NAND strings included in the memory block BLKi may be formed in a direction, perpendicular to the substrate.

Referring to FIG. 3, the memory block BLKi may include a plurality of memory NAND strings NS11 to NS33 connected between bitlines BL1, BL2, and BL3 and a common source line CSL. Each of the plurality of memory NAND strings NS11 to NS33 may include a string select transistor SST, a plurality of memory cells MC1, MC2, . . . , and MC8, and a ground select transistor GST. In FIG. 3, each of the plurality of memory NAND strings NS11 to NS33 is illustrated as including eight memory cells MC1, MC2, . . . , and MC8, but example embodiments are not limited thereto.

The string selection transistor SST may be connected to the corresponding string selection lines SSL1, SSL2, and SSL3. The plurality of memory cells MC1, MC2, . . . , and MC8 may be connected to corresponding gate lines GTL1, GTL2, . . . , and GTL8, respectively. The gate lines GTL1, GTL2, . . . , and GTL8 may correspond to wordlines, and some of the gate lines GTL1, GTL2, . . . , and GTL8 may correspond to dummy wordlines. The ground select transistor GST may be connected to corresponding ground select lines GSL1, GSL2, and GSL3. The string select transistor SST may be connected to corresponding bitlines BL1, BL2, and BL3, and the ground select transistor GST may be connected to the common source line CSL.

Wordlines (for example, WL1) having the same height may be connected in common, and the ground select lines GSL1, GSL2, and GSL3 and the string select lines SSL1, SSL2, and SSL3 may be separated from each other. In FIG. 3I, the memory block BLK is illustrated as being connected to the eight gate lines GTL1, GTL2, . . . , and GTL8 and the three bitlines BL1, BL2, and BL3, but example embodiments are not limited thereto.

Figure 4:
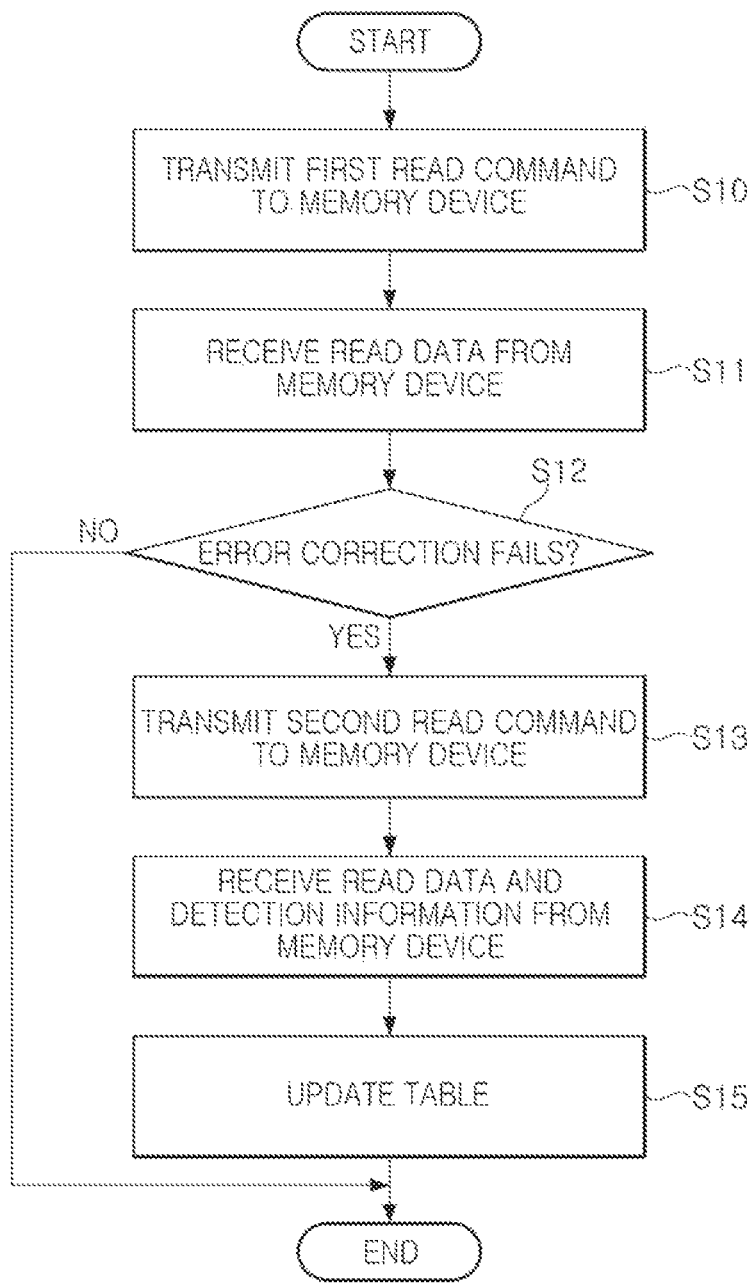
FIGS. 4 to 6 are flowcharts illustrating memory control operations according to example embodiments.
Figure 5:
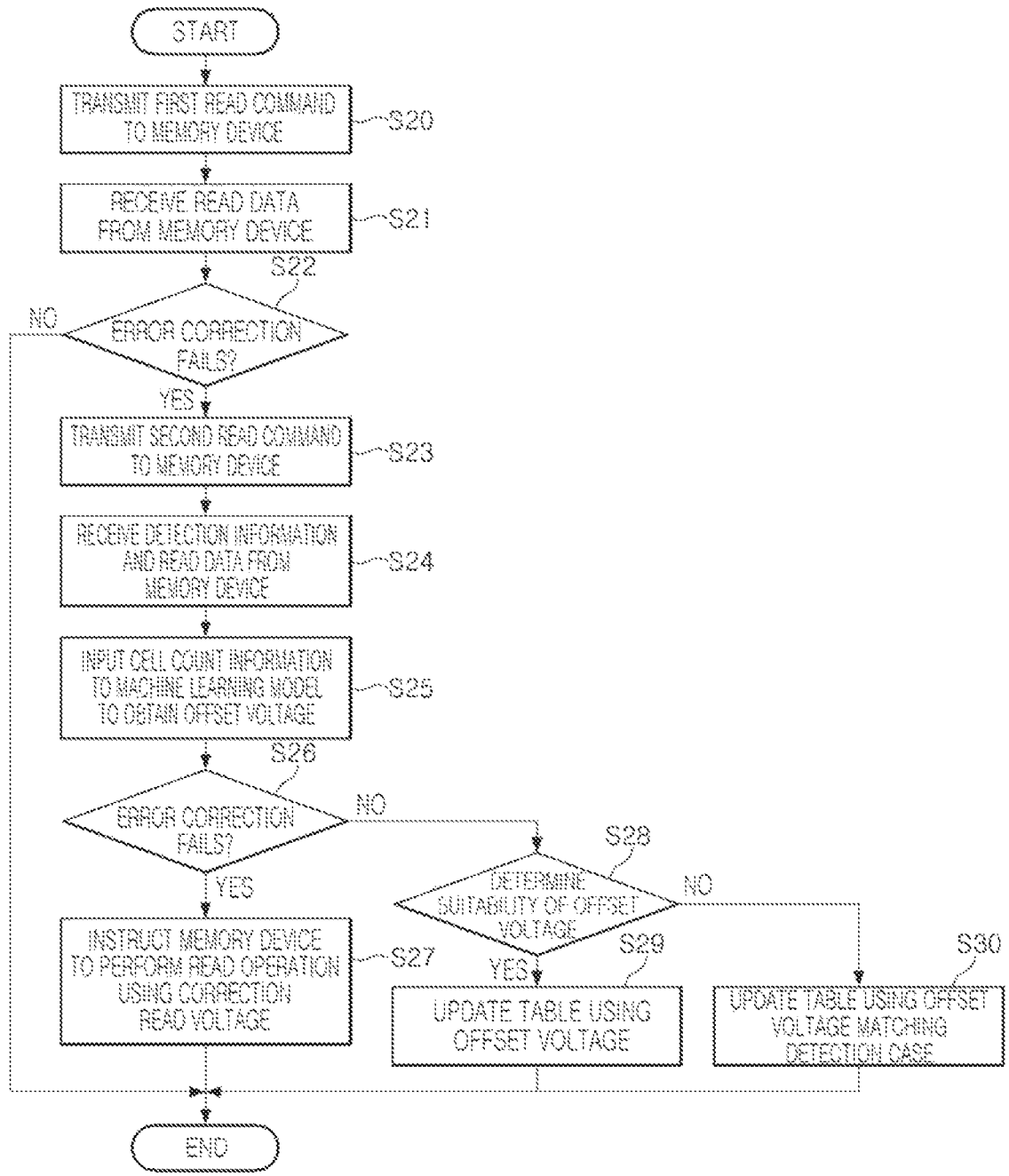
Figure 6:
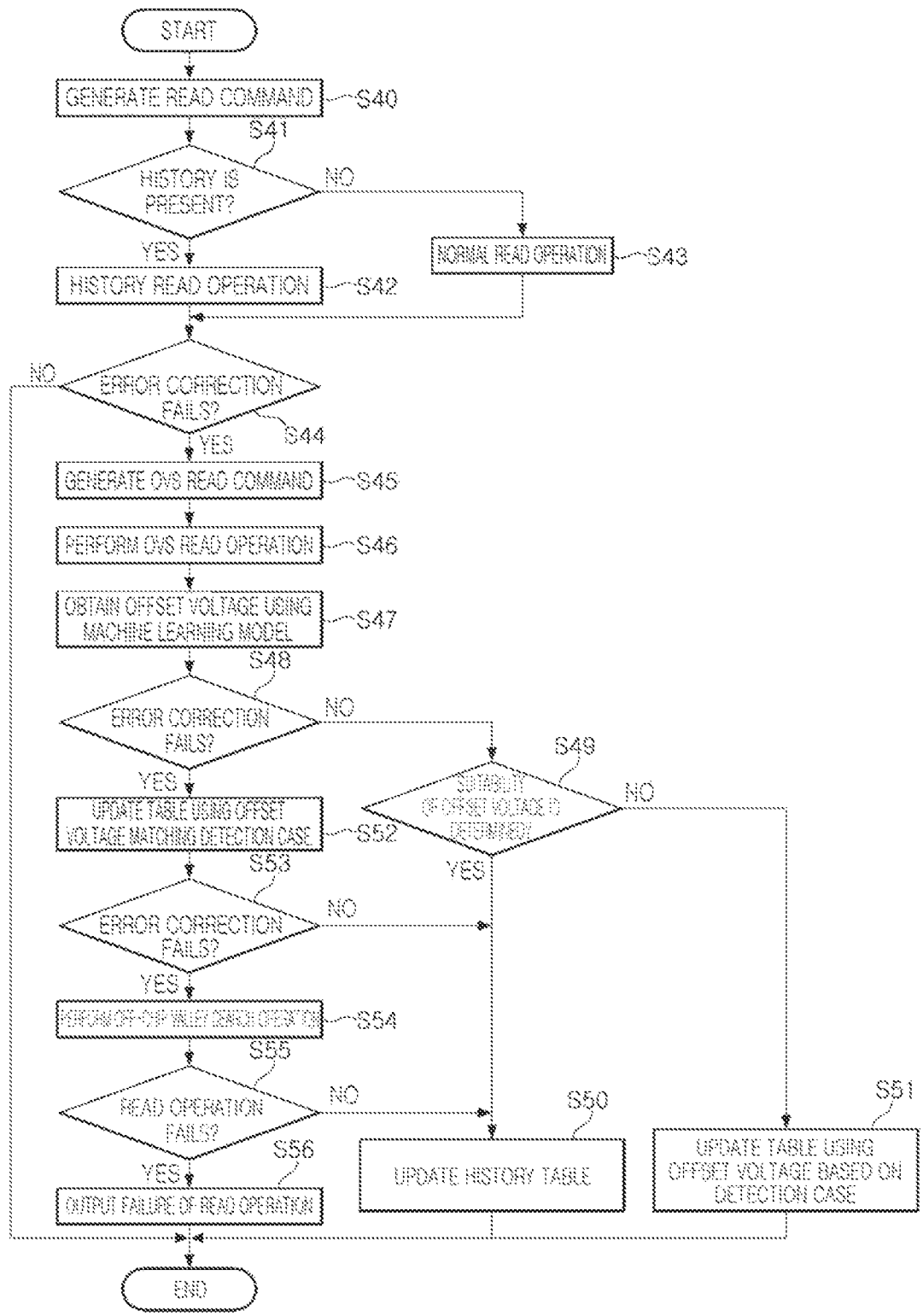

FIGS. 4 to 6 are flowcharts illustrating memory control operations according to example embodiments.

FIG. 4 is a flowchart illustrating operations of a memory controller according to example embodiments. Referring to FIG. 4, a memory controller according to example embodiments may transmit a first read command to a memory device (S10). The first read command may include a read voltage having a level determined by the memory controller. The memory device, which receives the first read command, may input a read voltage included in the first read command to a selected wordline connected to selected memory cells, and may input a pass voltage to unselected wordlines to execute a read operation. When the read operation is completed, the memory controller may receive read data from the memory device (S11).

An error correction circuit of the memory controller may check and correct an error in the read data and determine whether the error correction fails (S12). When the error correction circuit successfully corrects the error in the read data (S12, NO), the read operation may be completed. On the other hand, when the error correction circuit fails to correct the error in the read data (S12, YES), the memory controller may transmit a second read command to the memory device (S13). The second read command may be an OVS read command and the memory device, which receives the second read command, may execute an OVS read operation. When receiving the second read command, the memory device may enable the OVS circuit to obtain cell count information according to a threshold voltage distribution of memory cells, and may find an optimal detection case based on the cell count information. In addition, the memory device may execute a read operation in a manner of adjusting a development time in consideration of an offset voltage to be reflected in the read voltage depending on an optimal detection case.

The memory controller may receive read data and detection information from the memory device (S14). For example, in some embodiments, the memory controller may receive detection information, including cell count information, a detection case, and the like, together with read data, from the memory device. The memory controller may update a table, stored in the memory controller and in which an offset voltage for a read voltage is written, using the detection information (S15).

As an example, the table updated in operation S15 may be a history table for writing an offset voltage used to determine a level of the read voltage included in the first read command. In an embodiment, the level of the read voltage included in the first read command may be determined as a sum of a default voltage and the offset voltage written in the history table. In an embodiment, the cell count information included in the detection information received in operation S14 may be used to update the history table. Accordingly, the level of the read voltage, included in the first read command transmitted to the memory device in the next read operation, may be effectively optimized and reliability of the read operation and a speed of the read operation may be improved.

FIG. 5 is a flowchart illustrating operations of a memory controller according to example embodiments. Referring to FIG. 5, an operation of a memory controller according to example embodiments may start with an operation, in which the memory controller transmits a first read command to a memory device (S20), and an operation of receiving read data from the memory device in response to the first read command (S21). As an example, a level of a read voltage included in the first read command may be determined by a default voltage or may be determined based on a level of a previous read voltage succeeding in the read operation. An error correction circuit of the memory controller may check and correct an error in read data and determine whether the error correction fails (S22).

When the error correction circuit successfully corrects an error (S22, NO) or no error is detected in operation S22, the read operation may be terminated without a separate additional operation. On the other hand, when the error correction circuit fails to correct the error in operation S22 (S22, YES), the memory controller may transmit a second read command, including an OVS operation, to the memory device (S23). The memory device may execute an OVS read operation including a first sensing operation, in which a cell count representing a distribution of threshold voltages of selected memory cells is collected and a detection case based on the cell count is determined, and a second sensing operation in which a development time is changed depending on an offset voltage corresponding to the detection case, determined in the first sensing operation, to generate read data.

The memory controller may receive the detection information and the read data from the memory device (S24). The detection information may include cell count information and a detection case generated in the first sensing operation. The memory controller may input the cell count information to a machine learning model, pre-trained to output an optimal offset voltage for the read voltage, to obtain the offset voltage (S25). The offset voltage, obtained in operation S25, may be a dynamic offset voltage varying depending on the cell count information input to the machine learning model.

The error correction circuit may check and correct an error in the read data, received from the memory device, in response to the second read command and determine whether the error correction fails (S26). When the error correction circuit fails to correct an error in operation S26 (S26, YES), the memory controller may determine a corrected read voltage using the offset voltage obtained in operation S25, and may instruct the memory device to execute a read operation using the corrected read voltage (S27). As an example, in operation S27, the memory controller may transmit a first read command including the corrected read voltage to the memory device, and the memory device may input the corrected read voltage to a selected wordlines, connected to selected memory cells, to execute a read operation.

On the other hand, when the error correction circuit successfully corrects an error (S26, NO) or no error is detected in operation S26, the memory controller may determine suitability of the offset voltage output from the machine learning model in operation S25 (S28). When the offset voltage is determined to be suitable in operation S28 (S28, YES), the memory controller may update a table, stored in the memory controller, using the offset voltage output from the machine learning model (S29). On the other hand, when the offset voltage is not determined to be suitable in operation S28 (S28, NO), the memory controller may update the table using the offset voltage matching the detection case included in the detection information received in operation S24 (S30).

As an example, the memory controller may include first to third tables, as described above. When the offset voltage is determined to be suitable in operation S28, the third table, i.e., a history table, may be updated using the offset voltage output from the machine learning model in operation S25. On the other hand, when the offset voltage is not determined to be suitable in operation S28, the third table, i.e., a history table, may be updated based on the detection case obtained in operation S24 and the second table.

The offset voltage, output by the machine learning model in operation S25, may have a level different from a level of the offset voltage determined based on the detection case and the second table. As an example, when a difference between the offset voltage determined based on the detection case and the second table and the offset voltage output by the machine learning model in operation S25 is less than or equal to a threshold value, the memory controller may determine that the offset voltage is suitable, in operation S28. The threshold value may be predetermined.

FIG. 6 is a flowchart illustrating operations of a storage device according to example embodiments. Referring to FIG. 6, an operation of a storage device according to example embodiment may start with operation S40 in which a memory controller generates a read command. As an example, the memory controller of the storage device may generate a read command in response to a read request received from an external host. The memory controller may determine a level of a read voltage to generate the read command.

To determine the level of the read voltage, the memory controller may determine whether a history for the read request received from the external host is present (S41). As an example, the memory controller may determine whether a previous read request, corresponding to the read request received from the external host, is present in a buffer memory, or the like. When a previous read request corresponding to a currently received read request is present in the buffer memory (S41, YES), the memory controller may determine the level of the read voltage based on a history read level written in a table such as the buffer memory, or the like. Accordingly, the memory device may execute a history read operation (S42). On the other hand, when a previous read request corresponding to a currently received read request is not present in the buffer memory (S41, NO), the memory controller may determine the level of the read voltage as a default level, and the memory device may execute a normal read operation (S43).

An error correction circuit of the memory controller may execute an error correction operation on the read data received as a result of the read operation executed in operation S42 or S43 and determine whether the error correction fails (S44). When correction of an error in the read data is successfully executed (S44, NO) or no error is detected in the read data in operation S44, the read operation may be completed without an additional operation. On the other hand, when correction of an error in the read data fails in operation S44 (S44, YES), the memory controller may generate an OVS read command (S45).

The memory device, which receives the OVS read command from the memory controller, may execute an OVS read operation (S46). As described above, in the OVS read operation, the memory device may collect cell count information indicating a threshold voltage distribution of memory cells to determine a detection case and may execute a read operation to adjust a development time in consideration of an offset voltage corresponding to the detection case. The memory device according to example embodiments may generate detection information of the OVS read operation. The detection information may include cell count information and a detection case of the OVS read operation. As an example, the memory device may output detection information to the memory controller in response to a special command received from the memory controller.

The memory controller may obtain an offset voltage using a machine learning model (S47). As an example, the memory controller may receive detection information from the memory device as a result of the OVS read operation and may input cell count information, included in the detection information, to the machine learning model to obtain an offset voltage. The error correction circuit of the memory controller may detect and correct an error in read data, received from the memory device, as a result of the OVS read operation and may determine whether the error correction fails (S48).

When error correction is successfully executed (S48, NO) or no error is detected in operation S48, the memory controller may determine whether the offset voltage obtained in operation S47 is suitable (S49). When the offset voltage is suitable (S49, YES), the memory controller may update a history table using the offset voltage output from the machine learning model (S50). On the other hand, when the offset voltage is not suitable (S49, NO), the memory controller may newly define an offset voltage based on the detection case in detection information received as a result of the OVS read operation, and may update the history table using a corresponding offset voltage based on the detection case (S51).

When error correction fails in operation S48 (S48, YES), the memory device may execute a read operation using the corrected read voltage (S52). As an example, when error correction fails in operation S48, the memory controller may determine a corrected read voltage using the offset voltage obtained in operation S47 and may generate a read command, including the corrected read voltage, and transmit the read command to the memory device.

The memory controller may attempt to correct an error in the read data received again from the memory device and determine whether the error correction fails (S53). When the error correction is successfully executed in operation S53 (S53, NO), the memory controller may update the history table using the offset voltage reflected in the corrected read voltage, for example, the offset voltage obtained in operation S47 (S50). When the error correction fails in operation S53 (S53, YES), the memory device may execute an off-chip valley search operation to recover data (S54).

As an example, the off-chip valley search operation may be an operation in which a valley of a threshold voltage distribution is searched by sequentially scanning a voltage section while increasing or decreasing the voltage section by a predetermined level. The voltage section may be predetermined. The read operation is re-executed using a read voltage having a level corresponding to the valley of the threshold voltage distribution searched by the off-chip valley search operation, and the memory controller may determine whether the read operation fails (S55). When the read operation is determined to be successfully executed in operation S55 (S55, NO), the memory controller may update the history table based on the read voltage determined in the off-chip valley search operation (S50). On the other hand, when the read operation is determined to fail in operation S55 (S55, YES), the memory controller may output the failure of the read operation to a host (S56).

Figure 7:
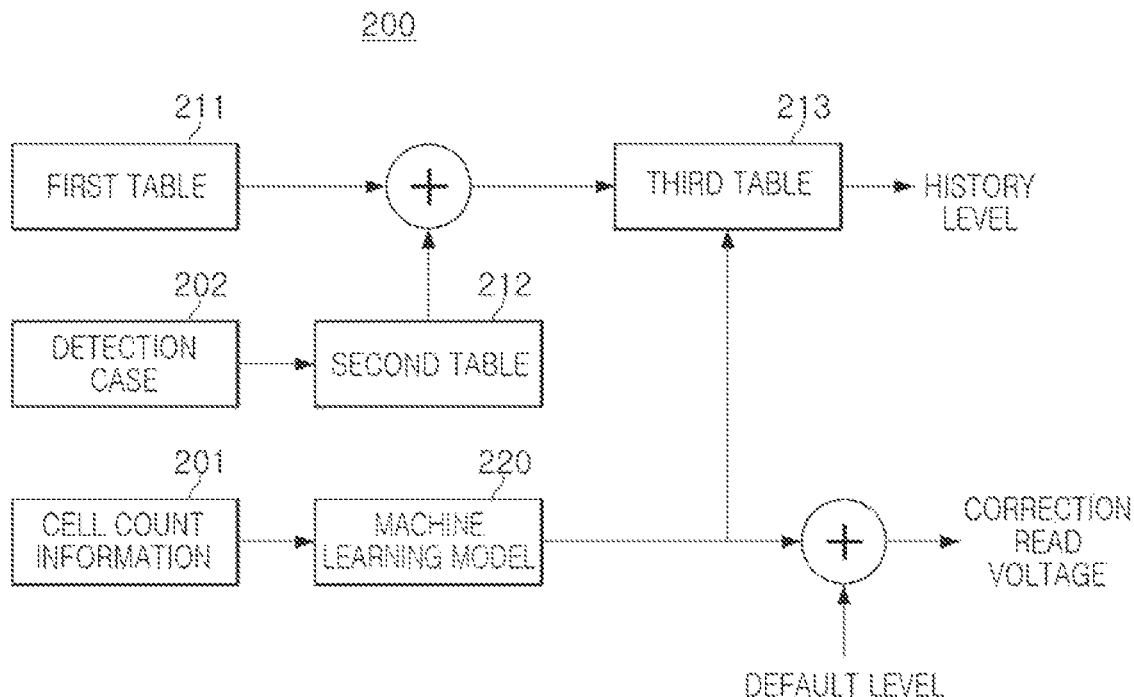
FIG. 7 is a diagram illustrating an operation of a memory controller according to example embodiments.

FIG. 7 is a diagram illustrating an operation of a memory controller according to example embodiments.

FIG. 7 may be a conceptual diagram illustrating a method of optimizing a level of a read voltage in a memory controller 200 to determine an optimal read level. Referring to FIG. 7, the memory controller 200 may determine an optimal read level using a first table 211, a second table 212, and a third table 213 stored in a buffer memory, or the like, and a machine learning model 220.

The first table 211 may write a first static offset voltage based on deterioration information such as a time elapsed after a program operation, an operating temperature, a program/erase operation cycle, and a read cycle. The second table 212 may write a second static offset voltage matching a detection case 202 in the detection information received from the memory device executing an OVS read operation. The third table 213 is a history table referred to so as to determine a read voltage in a history read operation, and may write a third static offset voltage.

The third static offset voltage of the third table 213 may be updated by an output of the machine learning model 220, or may be updated by the sum of a first static offset voltage and a second static offset voltage. The machine learning model 220 may output a dynamic offset voltage using the cell count information 201 in the detection information received as a result of the OVS read operation. When correction of an error in the read data received from the memory device by the OVS read operation is successfully executed and suitability of the dynamic offset voltage is recognized, the third table 213 may be updated using the dynamic offset voltage.

On the other hand, when correction of an error in the read data received from the memory device by the OVS read operation is successfully executed and suitability of the dynamic offset voltage is not recognized, the third table 213 may be updated using the sum of the first static offset voltage selected from the first table 211 and the second the second static offset voltages selected by applying the detection case 202 to the second table 212. When the detection of the error in read data received from the memory device by the OVS read operation fails, a level of a corrected read voltage may be determined by adding a dynamic offset voltage to a default voltage of the read voltage. When the correction of the error in the read data is successfully executed in a read operation using the corrected read voltage, the memory controller may update the third table 213 using the dynamic offset voltage.

Figure 8:
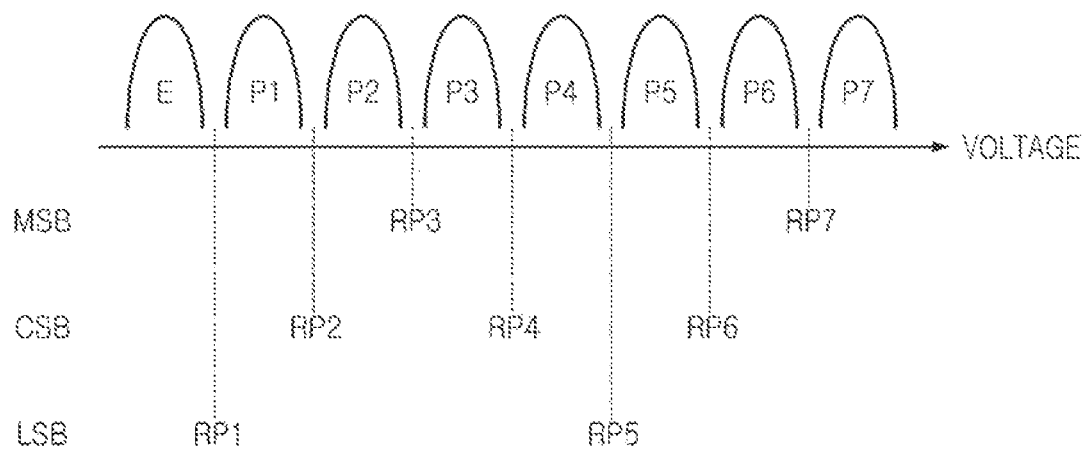
FIGS. 8 and 9 are diagrams illustrating operations of a memory device according to example embodiments.
Figures 9, 10:
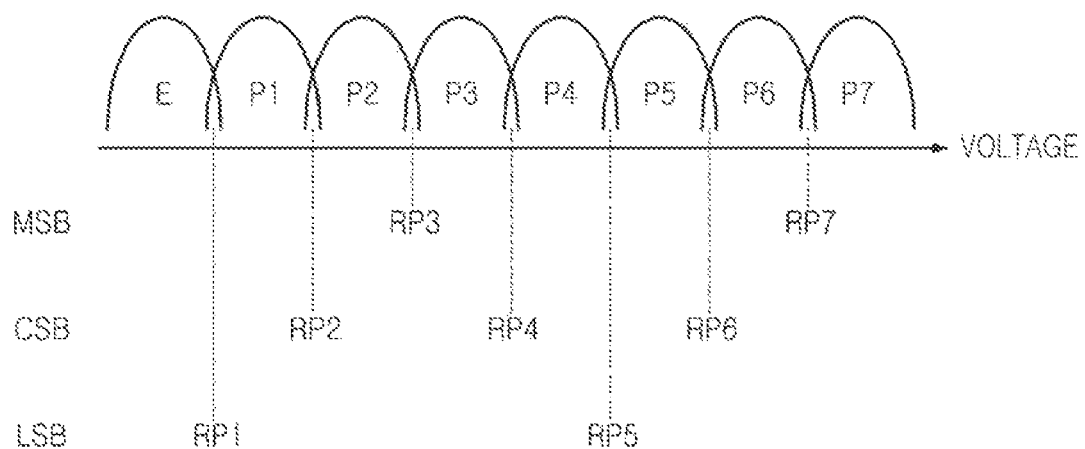
FIGS. 10 and 11 are diagrams illustrating an on-chip valley search operation of a memory device according to example embodiments.

FIGS. 8 and 9 are diagrams illustrating operations of a memory device according to example embodiments.

In an example embodiments illustrated in FIGS. 8 and 9, memory cells of the memory device may each be programmed in a triple level cell (TLC) manner in which three bits of data are stored per cell. Each of the memory cells may have one of eight states E to P7 depending on written data.

Referring to FIGS. 8 and 9, a read operation on each of the memory cells may be executed three times, and eight-state information may be output after being divided into three pages. In an example embodiment, the erase state E may be assigned to data '111:' a first program state P1 may be assigned to data '110,' a second program state P2 may be assigned to data '100,' a third program state P3 may be assigned to data '000,' a fourth program state P4 may be assigned to data '010,' a fifth program state P5 may be assigned to data '011,' a sixth program state P6 may be assigned to data '001', and a seventh program state P7 may be assigned to '101.' However, this is only one embodiment, and data assigned to the states E to P7 of each of the memory cells may be changed in various embodiments.

As an example, a read operation of a least significant bit (LSB) may include a first read operation using a first read voltage RP1 between the erase state E and the first program state P1 and a second read operation using a fifth read voltage RP5 between the fourth program state P4 and the fifth read voltage RP5. Similarly, a read operation of a most significant bit may include a first read operation using a third read voltage RP3 between the second program state P2 and the third program state P3 and a second read operation using a seventh read voltage RP7 between the sixth program state P6 and the seventh program state P7. A read operation of an intermediate significant bit may include a first read operation using a second read voltage RP2 between the first program state P1 and the second program state P2, a second read operation using a fourth read voltage RP4 between the third program state P3 and the fourth program state, and a third read operation using a sixth read voltage RP6 between the fifth program state P5 and the sixth program state P6.

An ideal threshold voltage distribution of the memory cells may be illustrated in FIG. 8. In this case, no error may be included in read data obtained from the memory cells using the read voltages RP1 to RP7, or an error may be corrected by an error correction circuit. However, as a time elapses after a program operation or as program/erase operations and a read operation are repeatedly executed, a threshold voltage distribution of the memory cells may be deteriorated as illustrated in FIG. 9.

Referring to FIG. 9, threshold voltage distributions may overlap each other in at least some of the states E to P7. In this case, when a read operation is executed using the read voltages RP1 to RP7 as they are, an error in read data may not be able to be corrected by the error correction circuit. Accordingly, in an example embodiment, levels of the read voltages RP1 to RP7 may be corrected using detection information generated in an OVS read operation while controlling the memory device to execute the OVS read operation. As a result, reliability of the read operation may be improved.

Figure 11:
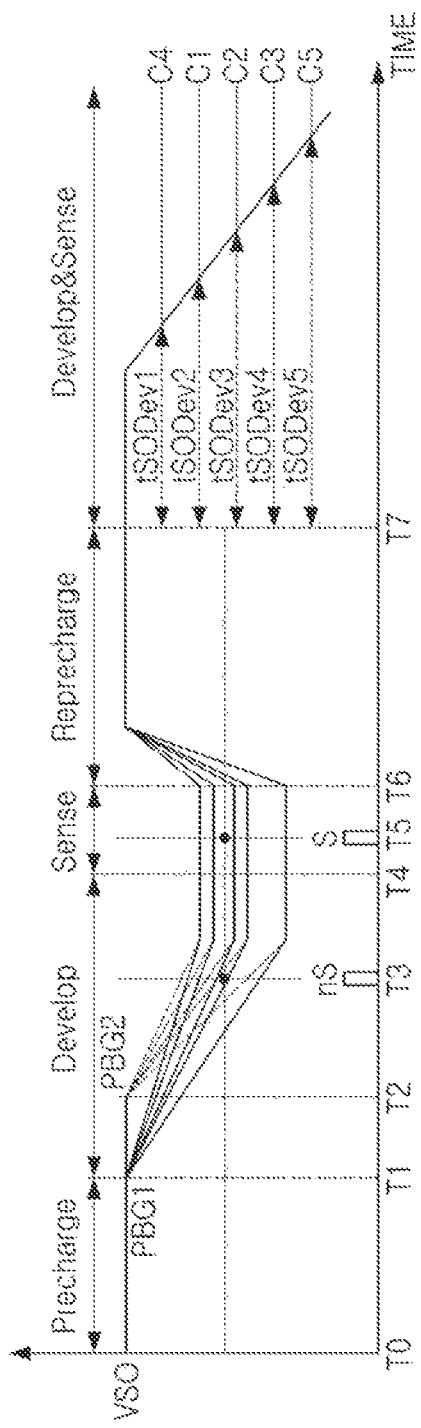

FIGS. 10 and 11 are diagrams illustrating an on-chip valley search operation of a memory device according to example embodiments.

Referring to FIG. 10, threshold voltage distributions of respective states S1 and S2 of memory cells of a memory device may be deteriorated by various factors to overlap each other as shown by way of example in FIG. 10. When the threshold voltage distributions overlap each other, an error may be included in read data, or an error in the read data may not be able to be corrected by an error correction circuit. In an example embodiment, when correction of the error in the read data fails, the memory controller may generate an OVS read command and may then transmit the generated OVS read command to the memory device.

In response to the OVS read command, the memory device may execute an OVS read operation of searching an optimal valley in threshold voltage distributions overlapping each other and generating read data. As an example, the OVS read operation may include an operation of determining an optimal detection case based on cell count information obtained from the threshold voltage distribution and an operation of adjusting a development time in consideration of an offset voltage which should be reflected in a read voltage according to the optimal detection case.

As an example, in the OVS read operation, a logic circuit of the memory device may input a first read voltage corresponding to a first detection case C1. Different pieces of data may be obtained from memory cells having a lower threshold voltage than a first read voltage and memory cells having a higher threshold voltage than the first read voltage, and the obtained data may be stored in a latch of a page buffer. Next, in the same manner as described above, a second read voltage corresponding to a second detection case C2 and a third read voltage corresponding to a third detection case C3 may be sequentially input and the obtained data may be stored in the latch.

Next, a count operation may be executed to calculate a cell count. An XOR operation is executed on data obtained by inputting the first read voltage and data obtained by inputting the second read voltage, and the number of XOR operations with a result of '1' may be determined as a first number X. The sentence "a result of the XOR operation is 1" may indicate a case in which data obtained by inputting the first read voltage and data obtained by inputting the second read voltage are different from each other. Similarly, an XOR operation may be executed on the data obtained by inputting the second read voltage and the data obtained by inputting the third read voltage, and the number of XOR operations with a result of '1' may be determined as a second number Y In an example embodiment, the first number X may correspond to the number of memory cells having a threshold voltage higher than the first read voltage and lower than the second read voltage, and the second number Y may correspond to the number of memory cells having a threshold voltage higher than the second read voltage and lower than the third read voltage.

The logic circuit of the memory device may estimate a distribution of a threshold voltage using the first number X and the second number Y, and may determine a detection case appropriate to the estimated distribution. As an example, an operation of determining the detection case may be defined as a first sensing operation, and a second sensing operation may be executed to actually generate read data based on the detection case determined in the first sensing operation.

Referring to FIG. 11, an OVS read operation may be executed using first page buffers PBG1 and second page buffers PBG2. A precharge operation may be executed from timing T0 to timing T1. A first bitline and a first sensing node, connected to each of first page buffers PBG1, may be charged in the precharge operation. For example, when bitline set-up signals are enabled, a sensing node and a first bitline may be precharged to a predetermined voltage level. When a first bitline set-up signal is disabled at timing T1, the precharge circuit of each of the first page buffers PBG1 may be turned off. The precharge circuit of each of the second page buffers PBG2 may be turned off at timing T2 later than timing T1. A level of a sensing node of each of the first page buffers PBG1 and a level of a sensing node of each of the second page buffers PBG2 may be changed by the magnitude of current flowing to a bitline, depending on whether a memory cell receiving the read voltage is turned on or off.

As illustrated in FIG. 11, each of the first page buffers PBG1 may precharge a sensing node from timing T0 to timing T1, and may develop first bitlines from timing T1 to timing T4. On the other hand, each of the second page buffers PBG2 may precharge the sensing node from timing T0 to timing T1, and may develop second bitlines from timing T2 to timing T4 later than timing T1.

The OVS read operation may include a first sensing operation, in which cell count information is collected and a detection case is determined based on the collected cell count information, and a second sensing operation in which a development operation is executed depending on the detection case, determined in the first sensing operation, to generate read data. The first sensing operation may include a latch reset (nS) sensing operation at timing T3 and a latch set (S) sensing operation at timing T5. First cell count information may be calculated using an ON-cell count value of the latch reset (nS) sensing operation and the latch set (S) sensing operation executed in the first page buffers PBG1. In addition, the second cell count information may be calculated using an ON-cell count value of the latch reset (nS) sensing operation and the latch set (S) sensing operation executed in the second page buffers PGB2.

Among detections cases C1 to C5 depending on states S1 and S2 of the memory cells, a detection case corresponding to an optimal read level may be determined based on the first cell count information and the second cell count information obtained in the first sensing operation. As an example, the detection case corresponding to the optimal read level may correspond to a distribution valley of the states S1 and S2 of the memory cells. In the second sensing operation, one of development time information tSODev1 to tSODev5 may be selected based on the detection case determined in the first sensing operation.

The cell count information, the detection case, and the like, generated in the OVS read operation may be output, as detection information, to the memory controller together with the read data generated in the OVS read operation.

When no error is present in the read data generated by the OVS read operation or the error is successfully corrected, the memory controller may input the cell count information to a machine learning model inside the memory controller to obtain a dynamic offset voltage and may determine suitability of the dynamic offset voltage, and then may update a table stored in the memory controller. As described above, the table may be a history table for writing an offset voltage to be applied to a read voltage in a history read operation. When the dynamic offset voltage is not suitable, the memory controller may update the history table using the offset voltage corresponding to the detection case.

When correction of an error in the read data generated by the OVS read operation fails, the memory controller may control the memory device to execute the read operation once again using a corrected read voltage reflecting the dynamic offset voltage. When no error is present in the read data obtained as a result of the read operation executed by the memory device again or the error is successfully corrected, the history table may be updated using the dynamic offset voltage.

In the example embodiment described with reference to FIGS. 10 and 11, the first number X and the second number Y may be respectively obtained while constantly changing the level of the read voltage input to the selected memory cells. Accordingly, a detection case and an offset voltage corresponding to the detection case may be determined.

Figure 12:
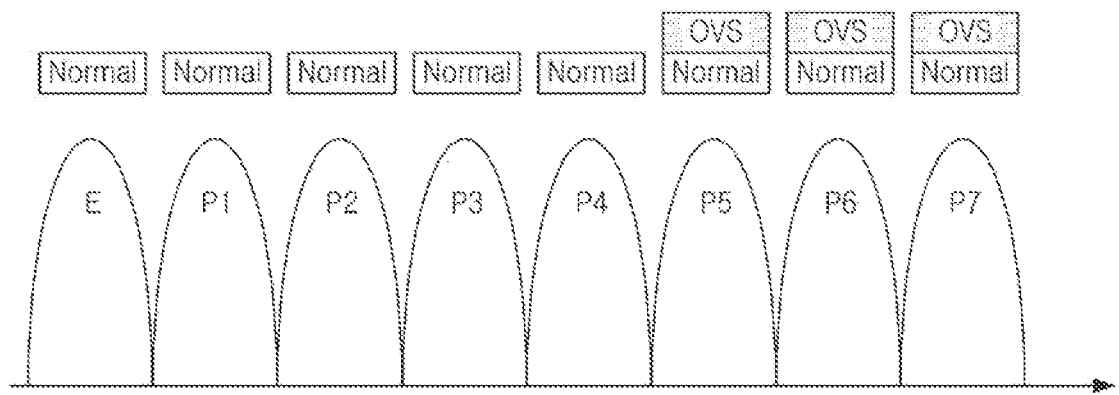
FIGS. 12 and 13 are diagrams illustrating operations of a memory device according to example embodiments.
Figure 13:
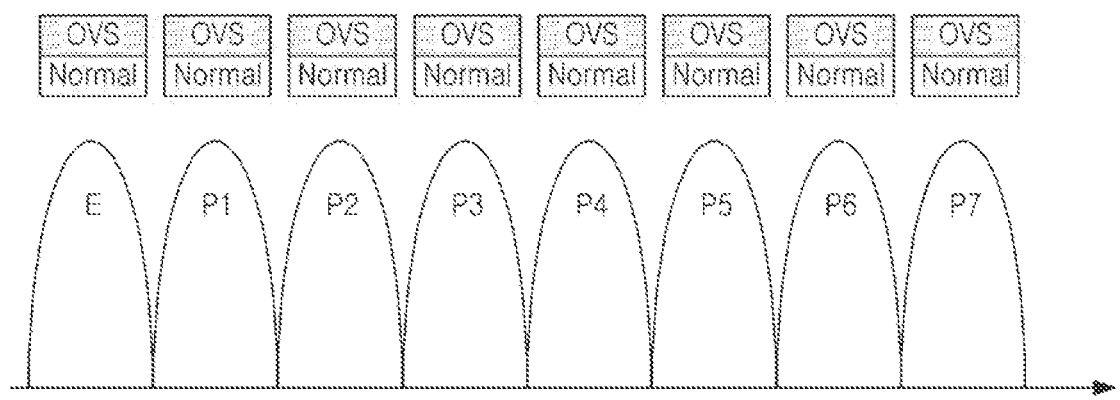

FIGS. 12 and 13 are diagrams illustrating operations of a memory device according to example embodiments.

Referring to FIG. 12, an OVS read operation may be applied only to some states P5 to P7, among states E to P7 that memory cells are able to have. As an example, some states P5 to P7 to which the OVS read operation is applied may be upper states, and may be states in which there is a high probability that a threshold voltage is deteriorated. Thus, in the example embodiment illustrated in FIG. 12, the OVS read operation may be executed once in respective read operations for determining a most significant bit (MSB), a central significant bit (CSB), and a least significant bit (LSB).

Referring to FIG. 13, an OVS read operation may be applied to all states E to P7 that memory cells are able to have. Thus, cell count information may be calculated in all of the states E to P7, and the OVS read operation may be executed multiple times in respective read operations for determining a most significant bit (MSB), a central significant bit (CSB), and a least significant bit (LSB).

In an example embodiment, when error correction of read data generated by an OVS read operation is successful, the memory controller may input cell count information to a machine learning model to obtain a dynamic offset voltage. The dynamic offset voltage may be used to update a history table after determination that the dynamic offset voltage is suitable. Alternatively, when correction of an error in read data generated by the OVS read operation fails, the memory device may re-execute a read operation using the corrected read voltage reflecting the dynamic offset voltage.

FIGS. 14 to 18 are diagrams illustrating a table update method of a memory controller according to example embodiments.

Figure 14:
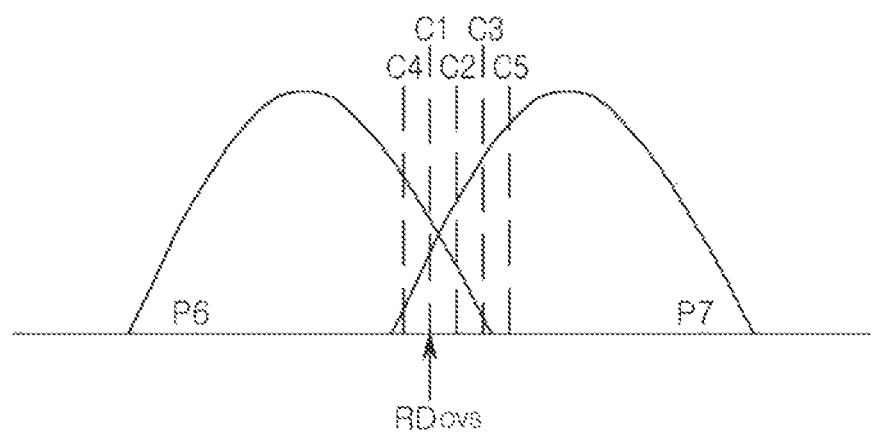
Figures 15, 16:
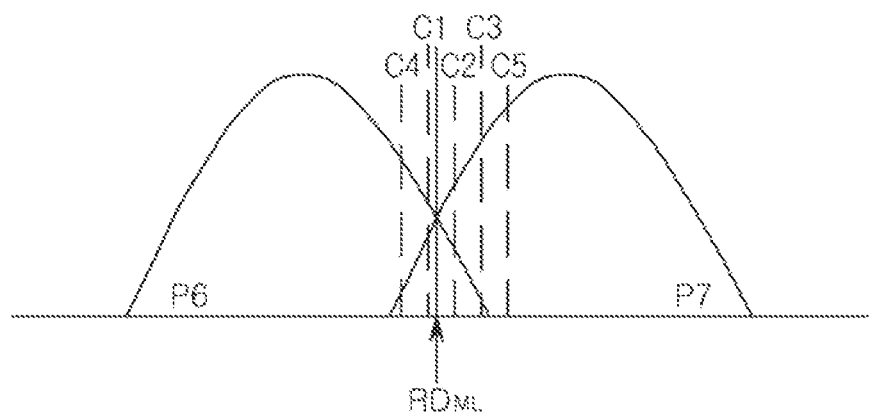

Referring to FIGS. 14 and 15, an OVS read operation for determining a most significant bit (MSB) may be executed. As described above with reference to FIGS. 8 and 9, a read operation using a read voltage between a sixth program state P6 and a seventh program state P7 may be executed to determine the most significant bit (MSB). However, as illustrated in FIGS. 14 and 15, a threshold voltage distribution may be deteriorated to overlap a threshold voltage distribution of the sixth program state P6 and a threshold voltage of the seventh program state P7, and a memory controller may fail to correct an error in read data. When the error correction fails, the memory controller may instruct the memory device to execute an OVS read operation.

As described above, the OVS read operation may include a first sensing operation, in which a detection case is determined using cell count information, and a second sensing operation in which read data is obtained based on the detection case. In the example embodiment illustrated in FIG. 14, the memory device may determine the detection case as a first a detection case C1, and may adjust a development time of the second sensing operation in consideration of an OVS read voltage $RD_{ovs}$ corresponding to the first detection case C1. As an example, the OVS read voltage $RD_{ovs}$ may have a level reflecting a first offset voltage corresponding to the first detection case C1 in a read voltage included in the OVS read operation. An example of the first offset voltage may be −80 mV.

The memory controller may receive cell count information, used to determine the first detection case C1, together with the first detection case C1. The memory controller may input the cell count information to a machine learning model to obtain a dynamic offset voltage. As an example, the dynamic offset voltage may have a level different from a level of the first offset voltage. In the example embodiment illustrated in FIG. 15, the dynamic offset voltage may be −76 mV.

Accordingly, as illustrated in FIG. 15, the corrected read voltage $RD_{ML}$, reflecting the dynamic offset voltage in the read voltage included in the OVS read operation, may have a level different from a level of the OVS read voltage $RD_{ovs}$. When correction of an error in the read data obtained in the second sensing operation is successfully executed, the memory controller may compare a difference between the dynamic offset voltage and the first offset voltage with a threshold value to determine whether the dynamic offset voltage is suitable. The threshold value may be predetermined. When the dynamic offset voltage is determined to be suitable, the memory controller may update a table stored in the memory controller using the dynamic offset voltage, as illustrated in FIG. 16.

As an example, the memory controller may store the first to third tables, and a table updated by a dynamic offset voltage that is recognized as suitable may be the third table, a history table. For example, the first table may be a table in which an offset voltage based on deterioration information of a memory device is written, and the second table may be a table in which the offset voltage is written by matching read voltages, input to memory cells, and detection cases.

When the dynamic offset voltage is determined to be not suitable, the memory controller may determine an offset voltage corresponding to the first detection case C1 based on the second table and may update the third table. FIG. 17 may be a diagram illustrating an example of the second table. As described above, the second table may match and write read voltages RP1 to RP7, applied depending on states that memory cells are able to have, and detection cases. When the dynamic offset voltage is not determined to be suitable in the example embodiment described with reference to FIGS. 14 and 15, the third table may be updated using −80 mV, i.e., an offset voltage determined by the second table, as illustrated in FIG. 18. According to example embodiments, when the offset voltage written in the first table is further added, an offset voltage updated in the third table may be higher or lower than −80 mV.

When correction of an error in the read data obtained in the second sensing operation fails, the memory controller may retransmit a read command, including the corrected read voltage $RD_{ML}$, to the memory device. The read command, including the modified read voltage $RD_{ML}$, may be a general read command rather than an OVS read command. When correction of an error in read data generated by a read operation using the corrected read voltage $RD_{ML}$ is successfully executed, the memory controller may update the third table using the dynamic offset voltage.

Since the dynamic offset voltage is determined by the machine learning model, the corrected read voltage $RD_{ML}$ reflecting the dynamic offset voltage may have higher accuracy than the OVS read voltage $RD_{ovs}$ determined based on the detection case, as illustrated in FIGS. 14 and 15. Accordingly, when the next read operation is executed as a history read operation, a read operation may be executed using a read voltage optimized for a threshold voltage distribution and reliability of the read operation may be improved. In addition, since the history read operation is executed using a dynamic offset voltage having higher accuracy than the offset voltage reflected in the OVS read voltage $RD_{ovs}$, error correction failures in the read operation and the number of times the OVS read operation is executed may be significantly reduced resulting in reduced latency of the read operation.

As an example, when a read operation is successfully executed on selected memory cells using the OVS read voltage $RD_{OVS}$, i.e., an optimal read voltage determined in the OVS read operation, a read command including a corrected read voltage $RD_{ML}$, rather than an OVS read voltage $RD_{OVS}$, may be transmitted to the memory device in a read operation re-executed on the same selected memory cells. Since the history table is updated using the dynamic offset voltage reflected in the corrected read voltage $RD_{ML}$, rather than the offset voltage reflected in the OVS read voltage $RD_{OVS}$, read voltages input to a selected wordline during read operations executed on the same selected memory cells may have different levels.

FIGS. 19 to 21 are diagrams illustrating a table update method of a memory controller according to example embodiments.

Referring to FIGS. 19 and 20, an OVS read operation for determining a central significant bit (CSB) may be executed. A read operation using a read voltage between a fifth program state P5 and a sixth program state P6 may be executed to determine the central significant bit (CSB). As illustrated in FIGS. 19 and 20, a threshold voltage distribution may be deteriorated, so that a threshold voltage distribution in a fifth program state P5 and a threshold voltage distribution in a sixth program state P6 may overlap each other, and the memory controller may fail to correct an error in reads data. When the error correction fails, the memory controller may instruct the memory device to execute a read OVS operation.

The OVS read operation may include a first sensing operation, in which a detection case is determined using cell count information, and a second sensing operation in which read data is obtained based on the detection case. In the example embodiment illustrated in FIG. 19, the memory device may determine the detection case as a first detection case C1, and may adjust a development time of the second sensing operation in consideration of an OVS read voltage $RD_{OVS}$ corresponding to the first detection case C1. As an example, the first offset voltage reflected in the OVS read voltage $RD_{OVS}$ may be −64 mV.

The memory controller may obtain a dynamic offset voltage by inputting cell count information used to determine the first detection case C1 into the machine learning model. For example, the dynamic offset voltage may have a different level from the first offset voltage. In the embodiment illustrated in FIG. 20, the dynamic offset voltage may be −58 mV.

When correction of an error in the read data acquired as a result of the OVS read operation is successfully executed, the memory controller may determine whether the dynamic offset voltage is suitable. When the dynamic offset voltage is determined to be suitable, the history table may be updated using the dynamic offset voltage, as illustrated in FIG. 21. When the next read operation is executed as a history read operation, the memory controller may reflect an offset voltage of −76 mV in a seventh read voltage RP7 and may reflect an offset voltage of −58 mV in a sixth read voltage RP6, and then may transmit the reflected offset voltages to the memory device. Accordingly, a read operation may be executed using the read voltage, optimized to deterioration of a threshold voltage distribution, to improve reliability of the read operation. In addition, a probability of executing the OVS red operation may be significantly reduced to improve speed of the read operation.

Figure 22:
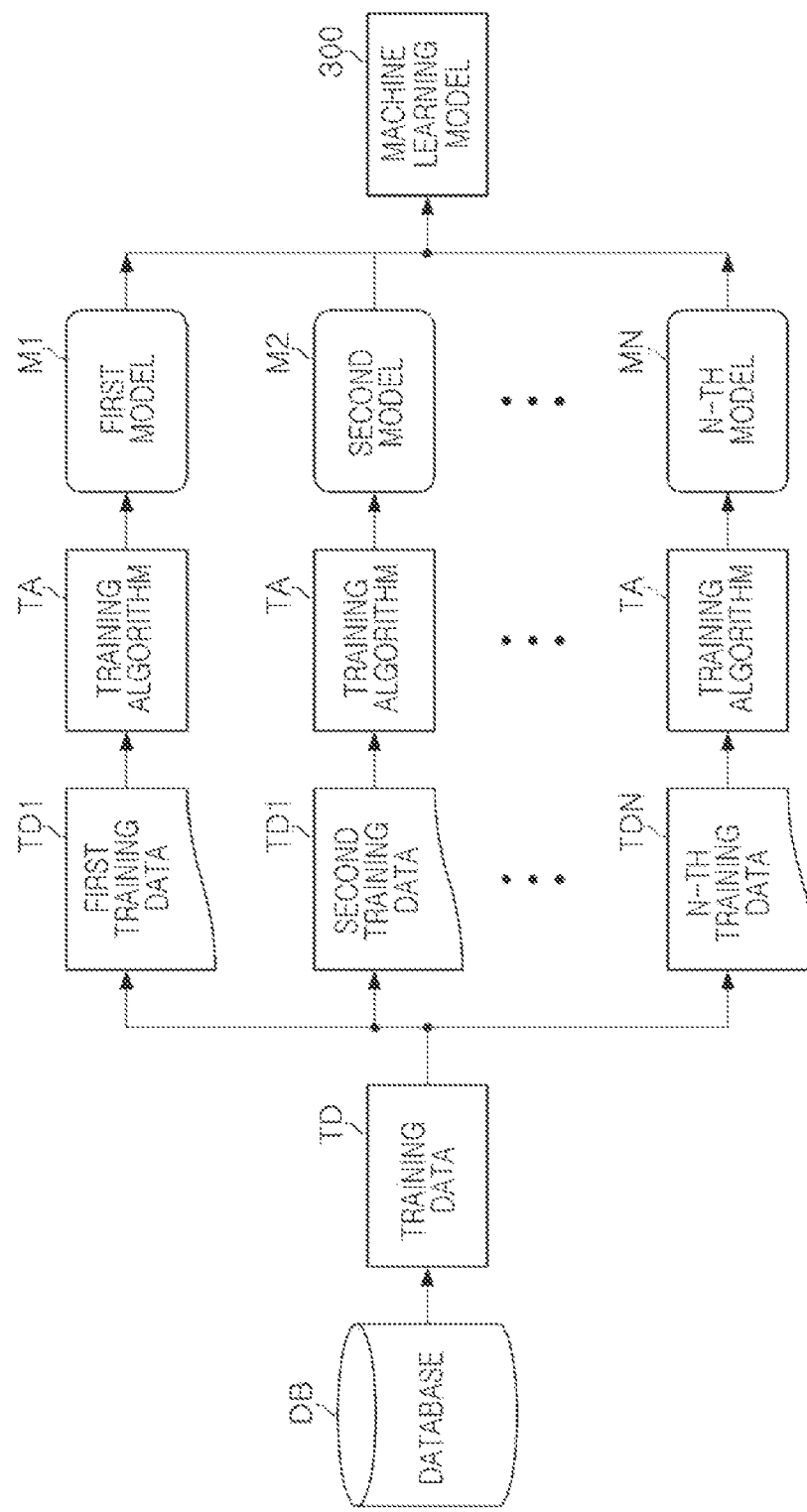
FIG. 22 is a diagram illustrating a machine learning model included in a memory controller according to example embodiments.

FIG. 22 is a diagram illustrating a machine learning model included in a memory controller according to example embodiments.

In an example embodiment, a machine learning model 300 may receive predetermined input data to output output data. As an example, the input data may be cell count information obtained as a result of an OVS read operation executed by a memory device. According to example embodiments, the input data may further include other degradation information. The degradation information may include a time elapsed after a program operation, program/erase operation cycles, a read operation cycle, and the like. The output data of the machine learning model 300 may be a dynamic offset voltage for determining an optimal level of a read voltage.

The machine learning model 300 may be pre-trained to receive cell count information, other degradation information, and the like, to output a dynamic offset voltage. Referring to FIG. 22, database DB may be provided to train the machine learning model 300, and training data TD may be stored in the database DB. To train the machine learning model 300, the training data TD may be selected from the database DB and may be classified into first to N-th training data TD1 to TDN.

As an example, the training data TD may include data indicating a degraded threshold voltage distribution of memory cells. The first to N-th training data TD1 to TDN may be generated by executing data pre-processing such as executing predetermined filtering on the training data TD, merging threshold voltage distributions having different resolutions, and the like. A training algorithm TA executes training using the first to N-th training data TD1 to TDN to generate a plurality of models M1 to MN. For example, the number of models M1 to MN may be determined according to the number of bits of data stored in each of the memory cells. As an example, when 3 bits of data are stored in each of the memory cells, at least seven trees may be generated by the training. When 4 bits of data are stored in each of the memory cells, at least fifteen trees may be generated by the training.

However, the embodiment described with reference to FIG. 22 is only an example for generating the machine learning model 300, and the machine learning model 300 may be generated in various other manners according to other example embodiments.

Figure 23:
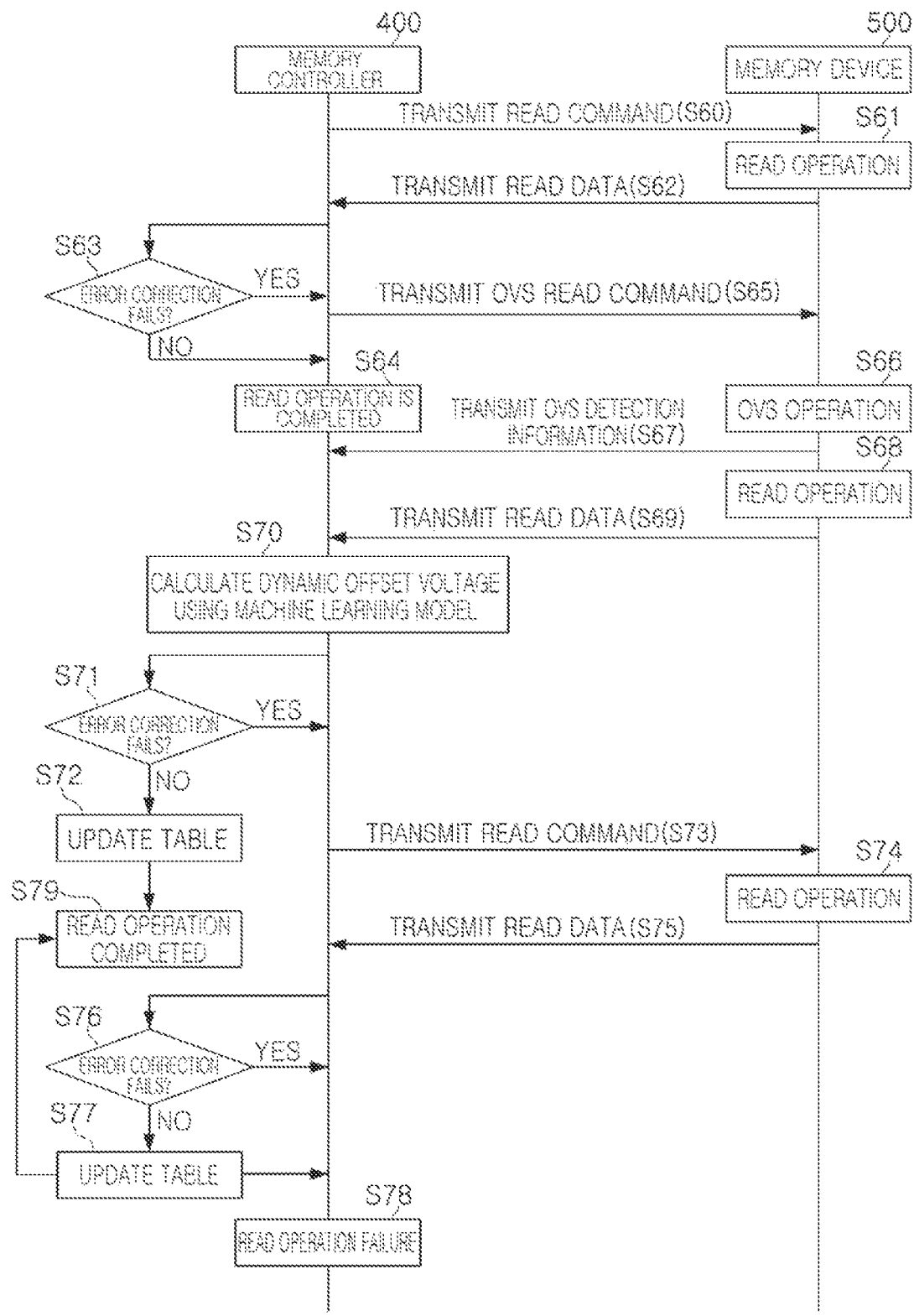
FIG. 23 is a diagram illustrating an operation of a storage device according to example embodiments.
Figure 24:
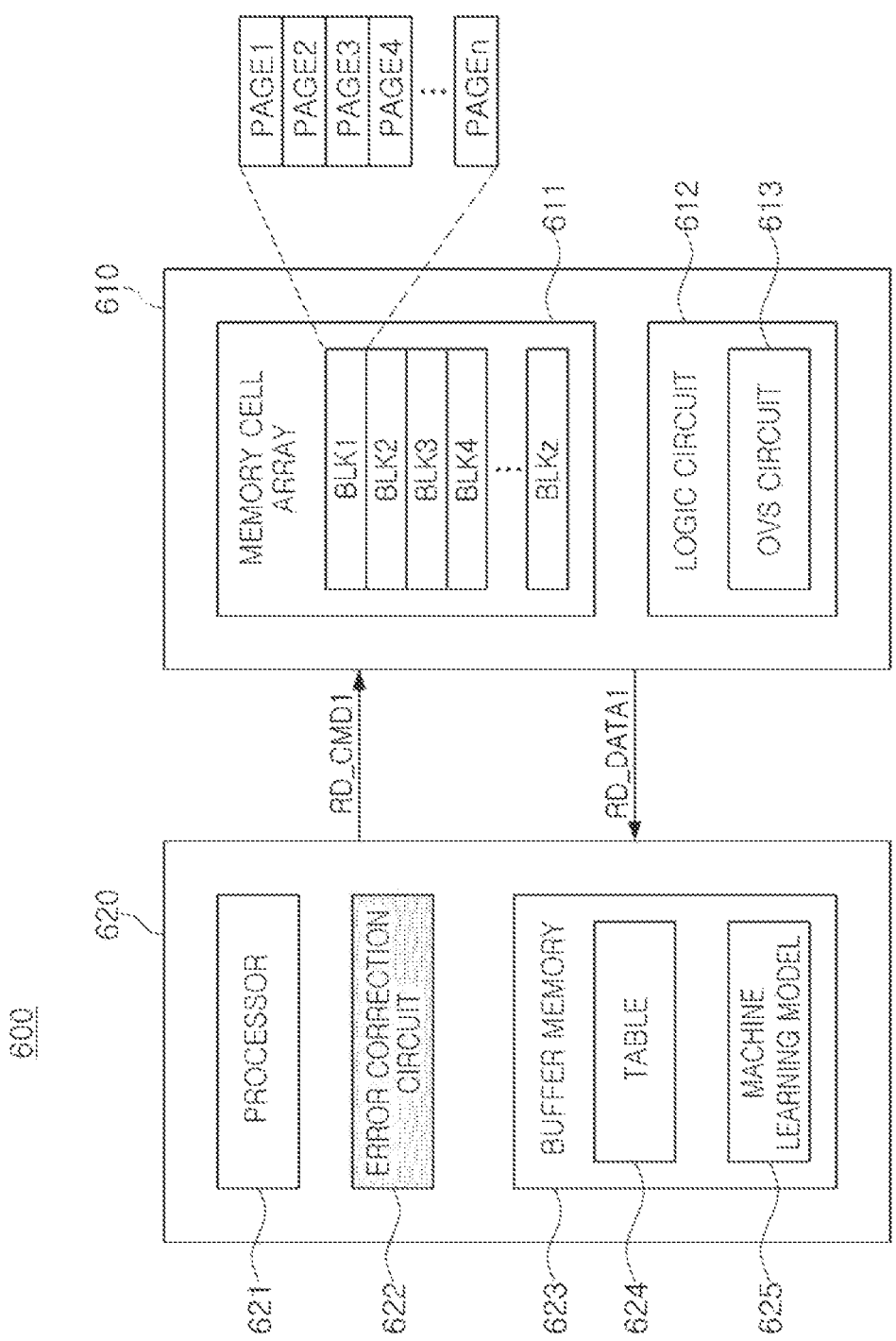
FIGS. 24 to 27 are diagrams illustrating operations of a storage device according to example embodiments.

FIG. 23 is a diagram illustrating an operation of a storage device according to example embodiments.

Referring to FIG. 23, an operation of a storage device according to an example embodiment may start with an operation S60 in which a memory controller 400 transmits a read command to a memory device 500. The memory controller 400 may generate a read command in response to a read request received from an external host connected to the storage device, and may transmit the generated read command to the memory device 500.

The read command may include a read voltage having a default level, together with an address signal. The default level is a value determined by the memory controller 400, and may be a level of an initial voltage previously stored in the memory controller 400 or determined by adding an offset voltage, written in a history table stored in the memory controller 400, to the initial voltage. The history table may be stored in a buffer memory of the memory controller 400, or the like.

The memory device 500 may execute a read operation on selected memory cells corresponding to address information in response to the read command (S61), and may transmit read data, as a result of the read operation, to the memory controller 400 (S62). An error correction circuit of the memory controller 400 may detect and correct an error in read data and determine whether error correction fails (S63). When the error correction circuit may successfully correct an error (S63, NO) or no error is detected, a read operation may be completed (S64). On the other hand, when the error correction circuit fails to correct an error (S63, YES), the memory controller 400 may transmit an OVS read command to the memory device 500 (S65).

The memory device 500, which receives the OVS read command, may execute an OVS operation (S66). As an example, the OVS operation may be an operation of controlling a plurality of page buffers to latch data in different times to search an optimal valley in a threshold voltage distribution. In the OVS operation, cell count information based on a threshold voltage distribution of memory cells and a detection case corresponding to the cell count information may be determined. When the OVS operation is completed, the memory device 500 may transmit OVS detection information to the memory controller 400 (S67). As an example, the OVS detection information may include cell count information and a detection case.

The memory device 500 may determine a development time in consideration of an offset voltage of a read voltage corresponding to the detection case determined in the OVS operation, and may execute a read operation (S68). The memory device 500 may transmit read data, as a response to the OVS read command, to the memory controller 400 (S69). According to example embodiments, the OVS operation and the read operation are completed, and then the memory device 500 may transmit read data and OVS detection information to the memory controller 400. In some example embodiments, the memory controller 400 may transmit a special command for obtaining OVS detection information to the memory device 500, and the memory device 500 may transmit detection information of the OVS operation to the memory controller 400 in response to the special command. The detection information may be transmitted through at least one of control pins and data pins connecting the memory controller 400 and the memory device 500, for example, at least one of data pins assigned to a data signal DQ.

The memory controller 400 may input the cell count information, included in the OVS detection information, to the machine learning model to calculate a dynamic offset voltage (S70). In addition, the error correction circuit of the memory controller 400 may detect and correct an error in the read data received from the memory device 500 in response to the OVS read command and determine whether the error correction fails (S71).

When error correction is successfully executed (S71, NO) or no error is detected in operation S71, the table is updated using the dynamic offset voltage calculated in operation S70 (S72), and the read operation may be completed S79. For example, the memory controller 400 may store a first table in which a first static offset voltage based on deterioration information is written, a second table in which a second static offset voltage matching a detection case according to a result of the OVS operation is written, a third table which is a history table storing the third static offset voltage reflected in the read voltage in a history read operation, and the like. In operation S72, the memory controller 400 may update the third table.

According to embodiments, the memory controller 400 may determine the suitability of the dynamic offset voltage calculated in operation S70, and then may determine a method of updating the third table based on a result of the suitability determination. As an example, the suitability of the dynamic offset voltage may be determined by comparing the second static offset voltage, determined based on the second table and the detection case included in the OVS detection information, with the dynamic offset voltage.

For example, when a difference between the dynamic offset voltage and the second offset voltage is less than or equal to a threshold value, the dynamic offset voltage may be determined to be suitable. When the dynamic offset voltage is determined to be suitable, the memory controller 400 may update the third table using the dynamic offset voltage. On the other hand, when the dynamic offset voltage is not determined to be suitable, the memory controller 400 may determine a second static offset voltage based on the second table and the detection case included in the OVS detection information received in operation S67, and may update a third table using the second static offset voltage and the first static offset voltage.

On the other hand, when the error correction circuit fails to correct an error in operation S71 (S71, YES), the memory controller 400 may generate a read command and may retransmit the read command to the memory device 500 (S73). The read command, transmitted to the memory device 500 in operation S73, may include address information such as the read command transmitted in operation S60, and may be a command indicating a general read operation.

In addition, the read command transmitted to the memory device 500 in operation S73 may include a corrected read voltage. The corrected read voltage may be determined by reflecting the dynamic offset voltage calculated in operation S70. The memory device 500 may execute a read operation to input a corrected read voltage to a selected wordline connected to selected memory cells (S74), and may transmit read data to the memory controller 400 (S75).

The error correction circuit of the memory controller 400 may detect and correct an error in the read data and determine whether the error correction fails (S76). When error correction is successfully executed (S76, NO) or no error is detected, the memory controller 400 may update the table using the dynamic offset voltage reflected in the corrected read voltage (S77) and may complete the read operation S79. The table updated in operation S77 may be a third table, i.e., a history table. On the other hand, when the error correction fails in operation S76 (S76, YES), the memory controller 400 may determine that the read operation has failed (S78), and may notify a host of the failure of the read operation. Alternatively, a read operation using an off-chip valley search operation may be additionally executed.

In the example embodiment described with reference to FIG. 23, when no error is detected in the read data or when correction of an error is successfully executed, the read operation may be completed once. In addition, when no error is detected in the read data obtained by the OVS read operation or when correction of an error is successfully executed, the read operation may be terminated twice. In addition, even when a read operation is executed using a corrected read voltage reflecting the dynamic offset voltage output from the machine learning model, a dynamic offset voltage may be obtained from the cell count information obtained in the OVS operation, so that an increase in latency of the read operation may be significantly reduced.

Irrespective of the success/failure of the OVS read operation, the dynamic offset voltage may be obtained by inputting cell count information to the machine learning model. When the OVS read operation is successful, a history table may be updated using the dynamic offset voltage to increase a success rate of the next read operation and to improve speed and reliability of the read operation. According to example embodiments, the suitability of the dynamic offset voltage may be determined to further improve the reliability of the history table.

FIGS. 24 to 27 are diagrams illustrating operations of a storage device according to example embodiments.

Referring to FIGS. 24 to 27, a storage device 600 may include a memory device 610 and a memory controller 620. The memory device 610 may include a memory cell array 611, including memory cells, and a logic circuit 612. The logic circuit 612 may include an OVS circuit 613 for executing an OVS operation. In the memory cell array 611, memory cells may be classified into a plurality of blocks BLK1 to BLKz. Each of the plurality of blocks BLK1 to BLKz may include a plurality of pages PAGE1 to PAGEn. The memory controller 620 may include a processor 621, an error correction circuit 622, and a buffer memory 623, and a table 624 and a machine learning model 625 may be stored in the buffer memory 623.

When receiving a read request from a host interconnected with the storage device 600, the processor 621 of the memory controller 620 may generate a first read command RD_CMD1 and transmit the generated first read command RD_CMD1 to the memory device 610. A read voltage, included in the first read command RD_CMD1, may have a first level. For example, the first level may be a default level preset to the memory controller 620 or a history level determined by reflecting an offset voltage, written in a history table in a table 624, in the default level.

The logic circuit 612 of the memory device 610 may execute a first read operation in response to the first read command RD_CMD1, and may output the first read data RD_DATA1 to the memory controller 620. The error correction circuit 622 of the memory controller 620 may detect and correct an error in the first read data. When no error is detected or when the error is successfully corrected, the read operation may be completed.

Figure 25:
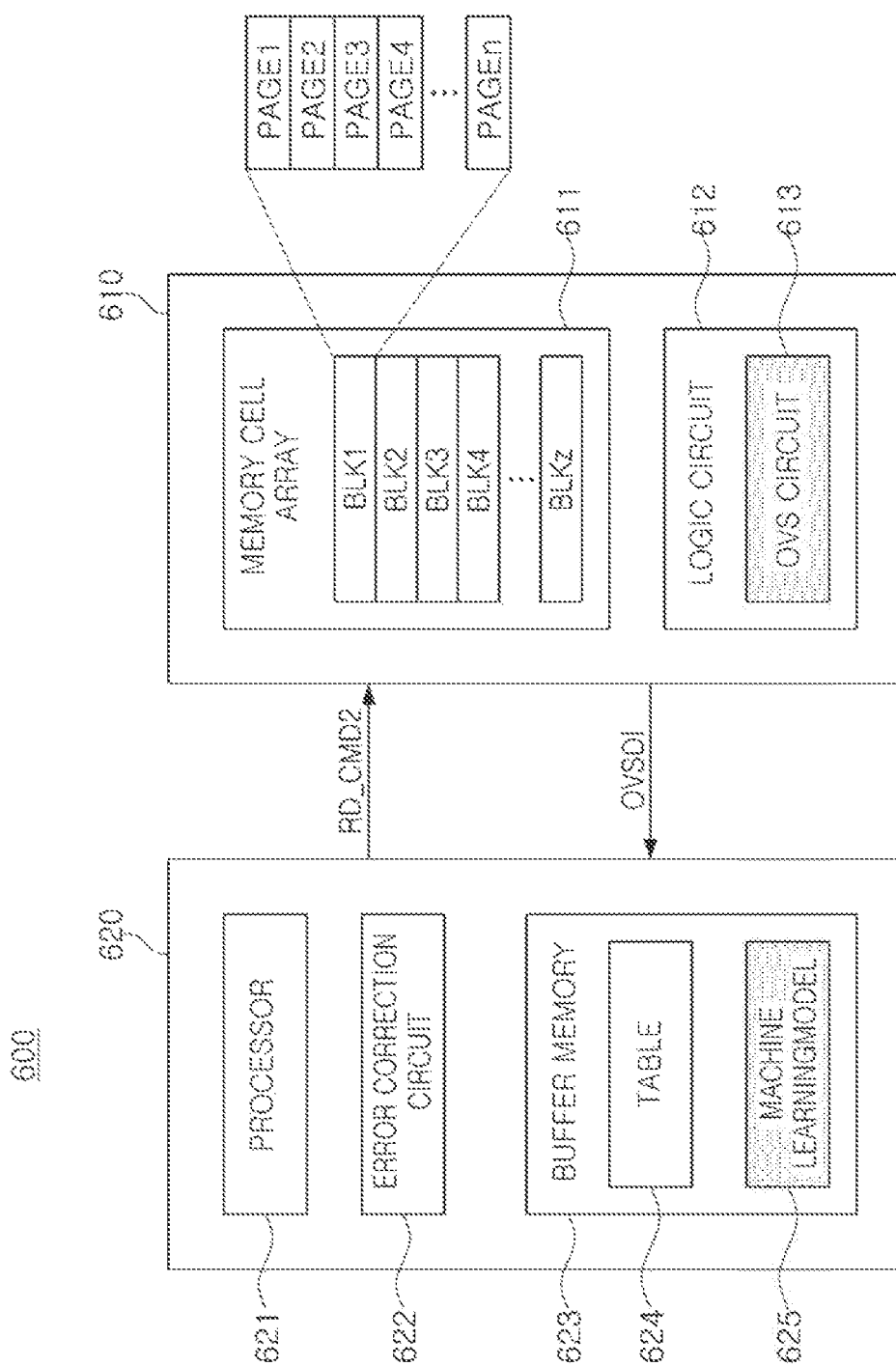

When the error correction circuit 622 fails to correct the error, the processor 621 may generate a second read command RD_CMD2 and may transmit the generated second read command RD_CMD2 to the memory device 610, as illustrated in FIG. 25. As an example, the second read command RD_CMD2 may be an OVS read command instructing an OVS operation. The logic circuit 612 of the memory device 610 may enable the OVS circuit 613 to execute an OVS operation, and may obtain OVS detection information OVSDI, such as cell count information and a detection case, as a result of the OVS operation. The memory device 610 may output the OVS detection information OVSDI to the memory controller 620. The memory device 610 may transmit the OVS detection information OVSDI to the memory controller 620.

Figure 26:
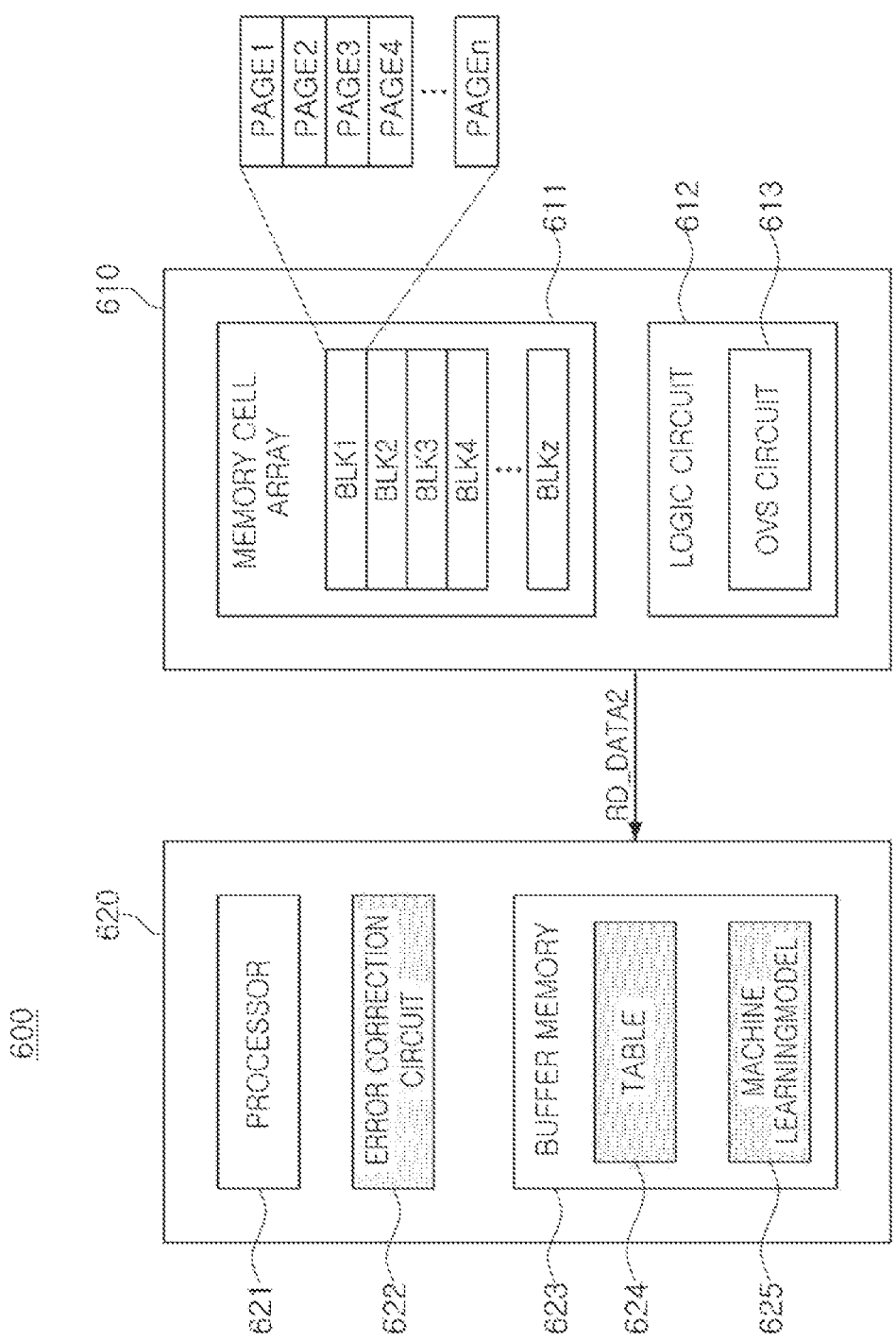
Figure 27:
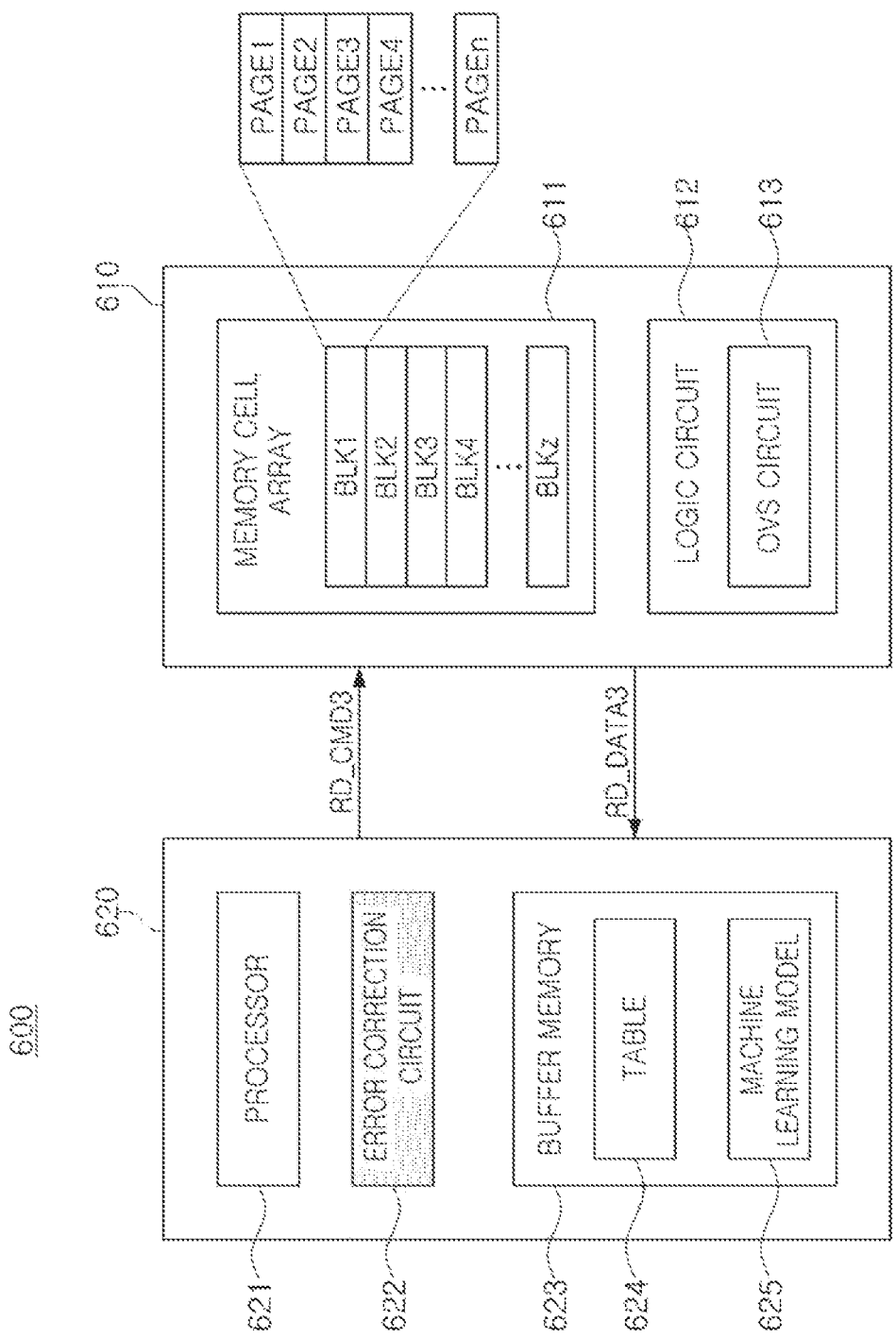

The memory controller 620 may input cell count information, included in the OVS detection information OVSDI, to the machine learning model 625 to obtain a dynamic offset voltage. In addition, as illustrated in FIG. 26, the memory device 610 may transmit the second read data RD_DATA2, as a response to the second read command RD_CMD2, to the memory controller 620. However, ahead of the OVS detection information OVSDI, the second read data RD_DATA2 may be transmitted to the memory controller 620, or the second read data RD_DATA2 and the OVS detection information OVSDI may be simultaneously transmitted to the memory controller 620.

The error correction circuit 622 may detect and correct an error in the second read data RD_DATA2. When no error is detected or when a detected error is successfully corrected, the processor 621 may update a table 624 using a dynamic offset voltage output by a machine learning model 625. In this case, according to example embodiments, when the dynamic offset voltage is determined to be suitable, the table 624 may be updated using the dynamic offset voltage. When the dynamic offset voltage is not determined to be suitable, the table 624 may be updated using a static offset voltage corresponding to a detection case included in the OVS detection information OVSDI.

When the error correction circuit 622 fails to correct the error in the second read data RD_DATA2, the error correction circuit 622 may generate a corrected read voltage, reflecting the dynamic offset voltage, and may transmit a third read command RD_CMD3, including the corrected read voltage, to the memory device 610. As an example, the third read command RD_CMD3 may be a command indicating the same read operation as the first read command RD_CMD1. In other words, the third read command RD_CMD3 may be the same command as the first read command RD_CMD1 except that the third read command RD_CMD3 includes a corrected read voltage having a level different from a level of the first read voltage. The memory device 620 may input the corrected read voltage, included in the third read command RD_CMD3, to a selected wordline, connected to the selected memory cells, to execute a read operation and may transmit the third read data RD_DATA3, as a result of the read operation, to the memory controller 620.

The error correction circuit 622 may detect and correct an error in the third read data RD_DATA3. When no error is detected or error correction is successfully executed, the processor 621 may update the table 624 using the dynamic offset voltage reflected in the corrected read voltage and may complete the read operation. When correction of an error in the third read data RD_DATA3 also fails, the memory controller 620 may control the memory device 610 to execute a read operation together with an off-chip valley search operation.

As described above, according to example embodiments, when the first read operation fails, the second read operation including the OVS operation may be executed. In addition, when the second read operation fails, the third read operation may be executed using the corrected read voltage generated using cell count information included in the detection information of the OVS operation, and the like. Thus, reliability of the read operation may be improved. In addition, the cell count information obtained in the OVS operation is input to the machine learning model to generate a corrected read voltage for the third read operation, so that an unnecessary dummy sensing operation may not be added. Thus, an increase in latency of the read operation may be significantly reduced and performance of the storage device 600 may be improved.

Figure 28:
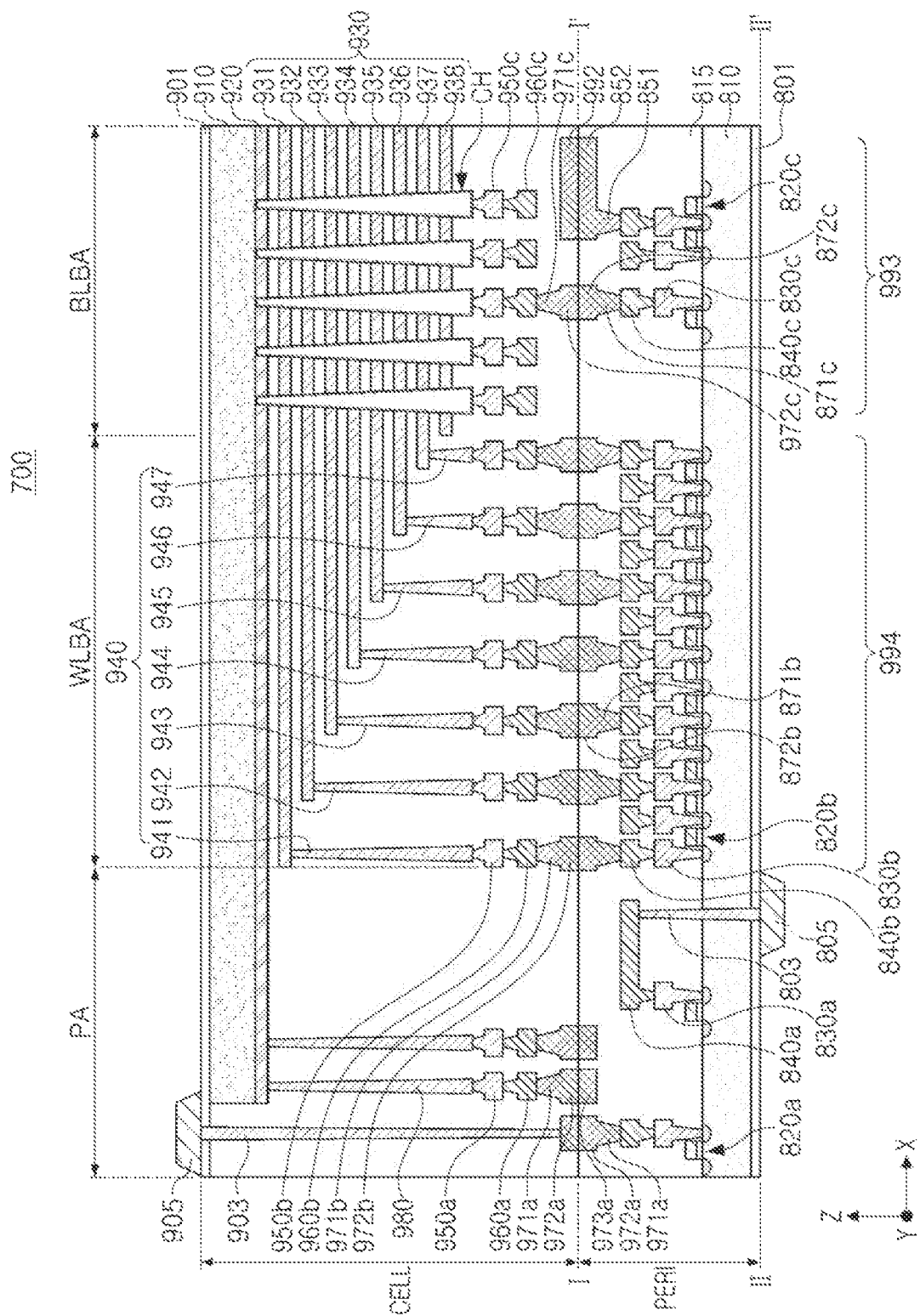
FIG. 28 is a schematic view of a memory device according to example embodiments.

FIG. 28 is a schematic view of a memory device according to example embodiments.

Referring to FIG. 28, a memory device 700 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then bonding the upper chip and the lower chip to each other. As an example, the bonding process may include a process of electrically connecting a bonding metal formed on a lowermost metal layer of the upper chip and a bonding metal formed on an uppermost metal layer of the lower chip. For example, when the bonding metals include copper (Cu), the bonding process may be a Cu-to-Cu bonding process, and the bonding metals may also be formed of aluminum (Al) or tungsten (W).

Each of the peripheral circuit region PERI and the cell region CELL of the memory device 700 may include an external pad bonding area PA, a wordline bonding area WLBA, and a bitline bonding area BLBA.

The peripheral circuit region PERI may include a first substrate 810, an interlayer insulating layer 815, a plurality of circuit elements 820a, 820b, and 820c formed on the first substrate 810, first metal layers 830a, 830b, and 830c respectively connected to the plurality of circuit elements 820a, 820b, and 820c, and second metal layers 840a, 840b, and 840c formed on the first metal layers 830a, 830b, and 830c. In an embodiment, the first metal layers 830a, 830b, and 830c may be formed of tungsten having relatively high electrical resistivity, and the second metal layers 840a, 840b, and 840c may be formed of copper having relatively low electrical resistivity.

In this specification, although only the first metal layers 830a, 830b, and 830c and the second metal layers 840a, 840b, and 840c are illustrated and described, the embodiment is not limited thereto, and one or more additional metal layers may be further formed on the second metal layers 840a, 840b, and 840c. At least a portion of the one or more additional metal layers formed on the second metal layers 840a, 840b, and 840c may be formed of aluminum or the like having a lower electrical resistivity than those of copper forming the second metal layers 840a, 840b, and 840c.

The interlayer insulating layer 815 may be disposed on the first substrate 810 to cover the plurality of circuit elements 820a, 820b, and 820c, the first metal layers 830a, 830b, and 830c, and the second metal layers 840a, 840b, and 840c. The interlayer insulating layer 815 may include an insulating material such as silicon oxide, silicon nitride, or the like.

Lower bonding metals 871b and 872b may be formed on the second metal layer 840b in the word line bonding area WLBA. In the word line bonding area WLBA, the lower bonding metals 871b and 872b in the peripheral circuit region PERI may be electrically bonded to upper bonding metals 971b and 972b of the cell region CELL. The lower bonding metals 871b and 872b and the upper bonding metals 971b and 972b may be formed of aluminum, copper, tungsten, or the like.

The cell region CELL may include at least one memory block. The cell region CELL may include a second substrate 910 and a common source line 920. A plurality of wordlines 931 to 938 (i.e., 930) may be stacked on the second substrate 910 in a direction (a Z-axis direction), perpendicular to an upper surface of the second substrate 910. String select lines and ground select lines may be arranged above and below the plurality of wordlines 930, respectively. The plurality of wordlines 930 may be disposed between the string select lines and the ground select lines.

In the bitline bonding area BLBA, a channel structure CH may extend in the direction (the Z-axis direction), perpendicular to the upper surface of the second substrate 910, to penetrate through the plurality of wordlines 930, the string select lines, and the ground select lines. The channel structure CH may include a data storage layer, a channel layer, a buried insulating layer, and the like, and the channel layer may be electrically connected to a first metal layer 950c and a second metal layer 960c. For example, the first metal layer 950c may be a bitline contact, and the second metal layer 960c may be a bitline. In an embodiment, the bitline 960c may extend in a first direction (a Y-axis direction), parallel to the upper surface of the second substrate 910.

In the embodiment illustrated in FIG. 28, an area in which the channel structure CH, the bitline 960c, and the like are disposed may be defined as the bitline bonding area BLBA. In the bitline bonding area BLBA, the bitline 960c may be electrically connected to the circuit elements 820c providing a page buffer 993 in the peripheral circuit region PERI. The bitline 960c may be connected to upper bonding metals 971c and 972c in the cell region CELL, and the upper bonding metals 971c and 972c may be connected to lower bonding metals 871c and 872c connected to the circuit elements 820c of the page buffer 993.

In the wordline bonding area WLBA, the wordlines 930 may extend in a second direction (an X-axis direction), parallel to the upper surface of the second substrate 910 and perpendicular to the first direction, and may be connected to a plurality of cell contact plugs 941 to 947 (i.e., 940). The plurality of wordlines 930 and the plurality of cell contact plugs 940 may be connected to each other in pads provided by at least a portion of the plurality of wordlines 930 extending by different lengths in the second direction. A first metal layer 950b and a second metal layer 960b may be connected to an upper portion of the plurality of cell contact plugs 940 connected to the plurality of wordlines 930, sequentially. The plurality of cell contact plugs 940 may be connected to the peripheral circuit region PERI through the upper bonding metals 971b and 972b of the cell region CELL and the lower bonding metals 871b and 872b of the peripheral circuit region PERI in the wordline bonding area WLBA.

The plurality of cell contact plugs 940 may be electrically connected to the circuit elements 920b forming a row decoder 994 in the peripheral circuit region PERI. In an embodiment, operating voltages of the circuit elements 820b providing the row decoder 994 may be different from operating voltages of the circuit elements 820c providing the page buffer 993. As an example, operating voltages of the circuit elements 820c providing the page buffer 993 may be greater than operating voltages of the circuit elements 820b providing the row decoder 994.

A common source line contact plug 980 may be disposed in the external pad bonding area PA. The common source line contact plug 980 may be formed of a conductive material such as a metal, a metal compound, polysilicon, or the like, and may be electrically connected to the common source line 920. A first metal layer 950a and a second metal layer 960a may be sequentially stacked on an upper portion of the common source line contact plug 980. As an example, an area in which the common source line contact plug 980, the first metal layer 950a, and the second metal layer 960a are disposed may be defined as the external pad bonding area PA.

Input/output pads 805 and 905 may be disposed in the external pad bonding area PA. Referring to FIG. 28, a lower insulating film 801 covering a lower surface of the first substrate 810 may be formed below the first substrate 810, and a first input/output pad 805 may be formed on the lower insulating film 801. The first input-output pad 805 may be connected to at least one of the plurality of circuit elements 820a, 820b, and 820c disposed in the peripheral circuit region PERI through a first input/output contact plug 803, and may be separated from the first substrate 810 by the lower insulating film 801. In addition, a side insulating film may be disposed between the first input/output contact plug 803 and the first substrate 810 to electrically separate the first input/output contact plug 803 and the first substrate 810.

Referring to FIG. 28, an upper insulating film 901 may be formed on the second substrate 910 to cover the upper surface of the second substrate 910, and a second input/output pad 905 may be disposed on the upper insulating layer 901. The second input/output pad 905 may be connected to at least one of the plurality of circuit elements 820a, 820b, and 820c disposed in the peripheral circuit region PERI through a second input/output contact plug 903.

According to embodiments, the second substrate 910 and the common source line 920 may not be disposed in an area in which the second input/output contact plug 903 is disposed. Also, the second input/output pad 905 may not overlap the word lines 930 in the third direction (the Z-axis direction). Referring to FIG. 28, the second input/output contact plug 903 may be separated from the second substrate 910 in a direction, parallel to the upper surface of the second substrate 910, and may penetrate through the interlayer insulating layer 815 of the cell region CELL to be connected to the second input/output pad 905.

According to embodiments, the first input/output pad 805 and the second input/output pad 905 may be selectively formed. As an example, the memory device 1000 may include only the first input-output pad 805 disposed on the first substrate 910 or the second input/output pad 905 disposed on the second substrate 910. Alternatively, the memory device 1000 may include both the first input/output pad 805 and the second input/output pad 905.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA of the memory device 700, a lower metal pattern 8873a having the same shape as an upper metal pattern 972a of the cell region CELL may be formed in an uppermost metal layer of the peripheral circuit region PERI to correspond to the upper metal pattern 972*a* formed on an uppermost metal layer of the cell region CELL. In the peripheral circuit region PERI, the lower metal pattern 873*a* formed in the uppermost metal layer of the peripheral circuit region PERI may not be connected to a contact. Similarly, in the external pad bonding area PA of the memory device 700, an upper metal pattern having the same shape as a lower metal pattern of the peripheral circuit region PERI may be formed in an upper metal layer of the cell region CELL to correspond to the lower metal pattern formed on an uppermost metal layer of the peripheral circuit region PERI.

The lower bonding metals 871*b* and 872*b* may be formed on the second metal layer 840*b* in the wordline bonding area WLBA. In the wordline bonding area WLBA, the lower bonding metals 871*b* and 872*b* of the peripheral circuit region PERI may be electrically connected to the upper bonding metals 971*b* and 972*b* of the cell region CELL by a bonding.

Further, in the bitline bonding area BLBA, an upper metal pattern 992, corresponding to a lower metal pattern 852 formed in the uppermost metal layer of the peripheral circuit region PERI, may have the same cross-sectional shape as the lower metal pattern 852 of the peripheral circuit region PERI and may be formed in an uppermost metal layer of the cell region CELL. A contact may not be formed on the upper metal pattern 992 formed in the uppermost metal layer of the cell region CELL.

As described above, according to various example embodiments, a memory controller may transmit a first read command and a second read command, different from each other, to a memory device. When an error in read data obtained from a memory device fails to be corrected using the first read command, the second read command instructing a memory device to execute an on-chip valley search operation may be transmitted to the memory device. When an error in read data obtained from the memory device fails to be corrected using the second read command, a table stored in the memory controller may be updated using an offset voltage obtained by inputting cell count information, received as a result of an OVS operation, to a machine learning model. Accordingly, an offset voltage optimized to a read operation may be written in the table to secure reliability of the read operation and to reduce a time required for the read operation to optimize performance of the memory device and a storage device.

While example embodiments have been shown and described above, it will be apparent to those of ordinary skill in the art that modifications and variations could be made without departing from the scope of the present disclosure as defined by the appended claims.

What is claimed is:

1. A memory controller comprising:
a plurality of control pins configured to output control signals to at least one memory device;
a plurality of data pins configured to transmit and receive a data signal to and from the at least one memory device;
a buffer memory configured to store a table in which a static offset voltage for a read operation is written, and to store a machine learning model that receives cell count information corresponding to a threshold voltage distribution of memory cells included in the at least one memory device and generates a dynamic offset voltage for the read operation;
an error correction circuit; and
a processor configured to, when the error correction circuit fails to correct an error in read data obtained from the at least one memory device, instruct the at least one memory device to perform an optimal read operation of adjusting an operating condition of the read operation and obtaining read data,
wherein, when the error correction circuit successfully corrects an error in read data obtained by the optimal read operation, the processor inputs the cell count information, received from the at least one memory device as a result of the optimal read operation, to the machine learning model to obtain the dynamic offset voltage and updates the table using the dynamic offset voltage.

2. The memory controller of claim 1, wherein, when the error correction circuit fails to correct the error in the read data obtained by the optimal read operation, the processor instructs the at least one memory device to perform a subsequent read operation using a corrected read voltage, in which the dynamic offset voltage is applied.

3. The memory controller of claim 1, wherein each of the memory cells has one state, among a plurality of states, depending on data written in each of the memory cells, and
the cell count information is information obtained by performing the optimal read operation on at least a portion of the plurality of states.

4. The memory controller of claim 3, wherein the cell count information includes a number of memory cells turned on or off by a read voltage of the optimal read operation in each of the plurality of states.

5. The memory controller of claim 1, wherein the machine learning model receives at least one of an address of a selected memory cell on which the optimal read operation is executed and deterioration information of the selected memory cell, together with the cell count information, to generate the dynamic offset voltage.

6. The memory controller of claim 1, wherein the optimal read operation includes an on-chip valley search (OVS) operation, and
the processor receives OVS detection information, including the cell count information and a detection case corresponding to the cell count information, from the at least one memory device as a result of the OVS operation.

7. The memory controller of claim 6, wherein the table includes a first table in which a first static offset voltage is written, a second table in which a second static offset voltage is written, and a third table in which a third static offset voltage for determining a history read voltage is written.

8. The memory controller of claim 7, wherein the processor updates the third table using the dynamic offset voltage when the error correction circuit successfully corrects the error in the read data obtained by the optimal read operation.

9. The memory controller of claim 7, wherein, when the error correction circuit successfully corrects the error in the read data obtained by the optimal read operation, the processor compares the second static offset voltage, determined using the detection case and the second table, with the dynamic offset voltage to determine whether the dynamic offset voltage is suitable.

10. The memory controller of claim 9, wherein the processor updates the third table using the dynamic offset voltage when the dynamic offset voltage is determined to be suitable, and the processor updates the third table using the second static offset voltage when the dynamic offset voltage is determined not to be suitable.

11. The memory controller of claim 1, wherein the processor generates a first read command and a second read command different from the first read command, and
the first read command is a command that controls the at least one memory device to execute the read operation based on a level of a read voltage determined by the processor, and the second read command is a command that controls the at least one memory device to execute the optimal read operation including an on-chip valley search (OVS) operation.

12. The memory controller of claim 11, wherein the processor retransmits the first read command to the at least one memory device when correction of an error in read data obtained by the second read command fails.

13. A storage device comprising:
at least one memory device; and
a memory controller connected to the at least one memory device by control pins, carrying at least one of a command latch enable (CLE) signal, an address latch enable (ALE) signal, a chip enable (CE) signal, a read enable (RE) signal, and a data strobe (DQS) signal, and data pins transmitting and receiving a data signal, the memory controller configured to store a table that stores a static offset voltage of a read voltage, and to determine a dynamic offset voltage,
wherein, when an error in first read data, output by the at least one memory device executing a first read operation is not corrected, the memory controller controls the at least one memory device to execute a second read operation including an on-chip valley search (OVS) operation, and
wherein, when an error in second read data, output by the at least one memory device executing the second read operation is corrected, the memory controller updates the table using the dynamic offset voltage obtained by inputting at least a portion of OVS detection information, generated by the OVS operation, to a machine learning model.

14. The storage device of claim 13, wherein the at least one memory device includes memory cells, and each of the memory cells stores two or more bits of data and has at least one state, among a plurality of states, determined by the data.

15. The storage device of claim 14, wherein the OVS detection information includes cell count information, indicating a number of memory cells determined to be turned on or off by a level of the read voltage in each of the plurality of states, and a detection case selected from the cell count information to determine a development time of the second read operation.

16. The storage device of claim 13, wherein the memory controller instructs the memory device to execute the first read operation using a corrected read voltage, in which the dynamic offset voltage is applied, when the error in the second read data is not corrected.

17. A memory device comprising:
an input/output interface including a plurality of control pins that receive control signals from a memory controller, and a plurality of data pins over which a data signal is transmitted to and received from the memory controller, the input/output interface configured to receive a first read command and a second read command from the memory controller;
a memory cell array having a plurality of memory cells; and
a logic circuit configured to output read data, obtained from the plurality of memory cells, to the memory controller in response to at least one of the first read command and the second read command,
wherein when the second read command is received after a first read operation corresponding to the first read command is executed on selected memory cells of the plurality of memory cells, a second read operation, different from the first read operation, is executed and detection information generated in the second read operation is output to the memory controller, and
wherein when a read command instructing a history read operation for selected memory cells of the plurality of memory cells is received, a read voltage included in the read command has a level different from a level of an optimal read voltage determined in the second read operation.

18. The memory device of claim 17, wherein the logic circuit outputs the detection information, before outputting the read data, to the memory controller in response to the second read command.

19. The memory device of claim 17, wherein the logic circuit includes an OVS circuit configured to generate cell count information and to execute an on-chip valley search (OVS) operation of determining a detection case based on the cell count information, in response to the second read command.

20. The memory device of claim 19, wherein the plurality of memory cells have a plurality of states, and the OVS circuit executes the OVS operation on a portion of the plurality of states.

* * * * *